(12) United States Patent
Nyseth

(10) Patent No.: US 6,776,289 B1
(45) Date of Patent: Aug. 17, 2004

(54) WAFER CONTAINER WITH MINIMAL CONTACT

(75) Inventor: David L. Nyseth, Plymouth, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 09/523,745

(22) Filed: Mar. 13, 2000

Related U.S. Application Data

(63) Continuation-in-part of application No. 08/954,640, filed on Oct. 20, 1997, now abandoned, which is a continuation-in-part of application No. 08/678,886, filed on Jul. 12, 1996, now Pat. No. 5,788,082.

(51) Int. Cl.⁷ .............................................. B65D 85/48
(52) U.S. Cl. ....................................... 206/711; 206/454
(58) Field of Search ............................... 206/454, 701, 206/710, 711; 118/500, 728; 211/41.18; 414/217, 221, 222

(56) References Cited

U.S. PATENT DOCUMENTS

| | | | |
|---|---|---|---|
| 4,534,389 A | | 8/1985 | Tullis |
| 4,674,939 A | | 6/1987 | Maney et al. |
| 4,676,008 A | | 6/1987 | Armstrong |
| 4,724,963 A | * | 2/1988 | Mortensen ................ 206/454 |
| 4,739,882 A | | 4/1988 | Parikh et al. |
| 4,779,732 A | | 10/1988 | Boehm et al. |
| 4,815,912 A | | 3/1989 | Maney et al. |
| 4,872,554 A | | 10/1989 | Quernemoen |
| 4,930,634 A | * | 6/1990 | Williams et al. ........... 206/454 |
| 5,054,418 A | | 10/1991 | Thompson et al. |
| 5,061,144 A | | 10/1991 | Akimoto et al. |
| 5,253,755 A | | 10/1993 | Maenke |
| 5,255,797 A | | 10/1993 | Kos |
| 5,452,795 A | * | 9/1995 | Gallagher et al. .......... 206/711 |
| 5,476,176 A | | 12/1995 | Gregerson et al. |
| 5,492,229 A | | 2/1996 | Tanaka et al. |
| 5,534,074 A | | 7/1996 | Koons |
| 5,584,401 A | | 12/1996 | Yoshida |
| 5,706,946 A | | 1/1998 | Kakizaki et al. |
| 5,782,361 A | | 7/1998 | Kakizaki et al. |
| 5,788,082 A | * | 8/1998 | Nyseth ....................... 206/711 |

FOREIGN PATENT DOCUMENTS

| | | |
|---|---|---|
| JP | 08-7637 | 4/1994 |
| WO | 96/14273 | 11/1990 |
| WO | 96/09787 | 4/1996 |

OTHER PUBLICATIONS

US 5,762,201, 6/1998, Whalen (withdrawn)

* cited by examiner

Primary Examiner—David T. Fidei
(74) Attorney, Agent, or Firm—Patterson, Thuente, Skaar & Christensen, P.A.

(57) ABSTRACT

A wafer carrier for transporting or holding wafers in a horizontal axially aligned arrangement has minimal four point regions of wafer support at the edge portion of the wafers. A preferred embodiment is an H-bar carrier with a plurality of slots defined by elongate wafer guides on the carrier sidewalls. Upwardly extended protrusions support the wafers with minimal contact with the carrier. The protrusions are sufficient in number and configuration to preclude contact with the top surface of the guides.

17 Claims, 20 Drawing Sheets

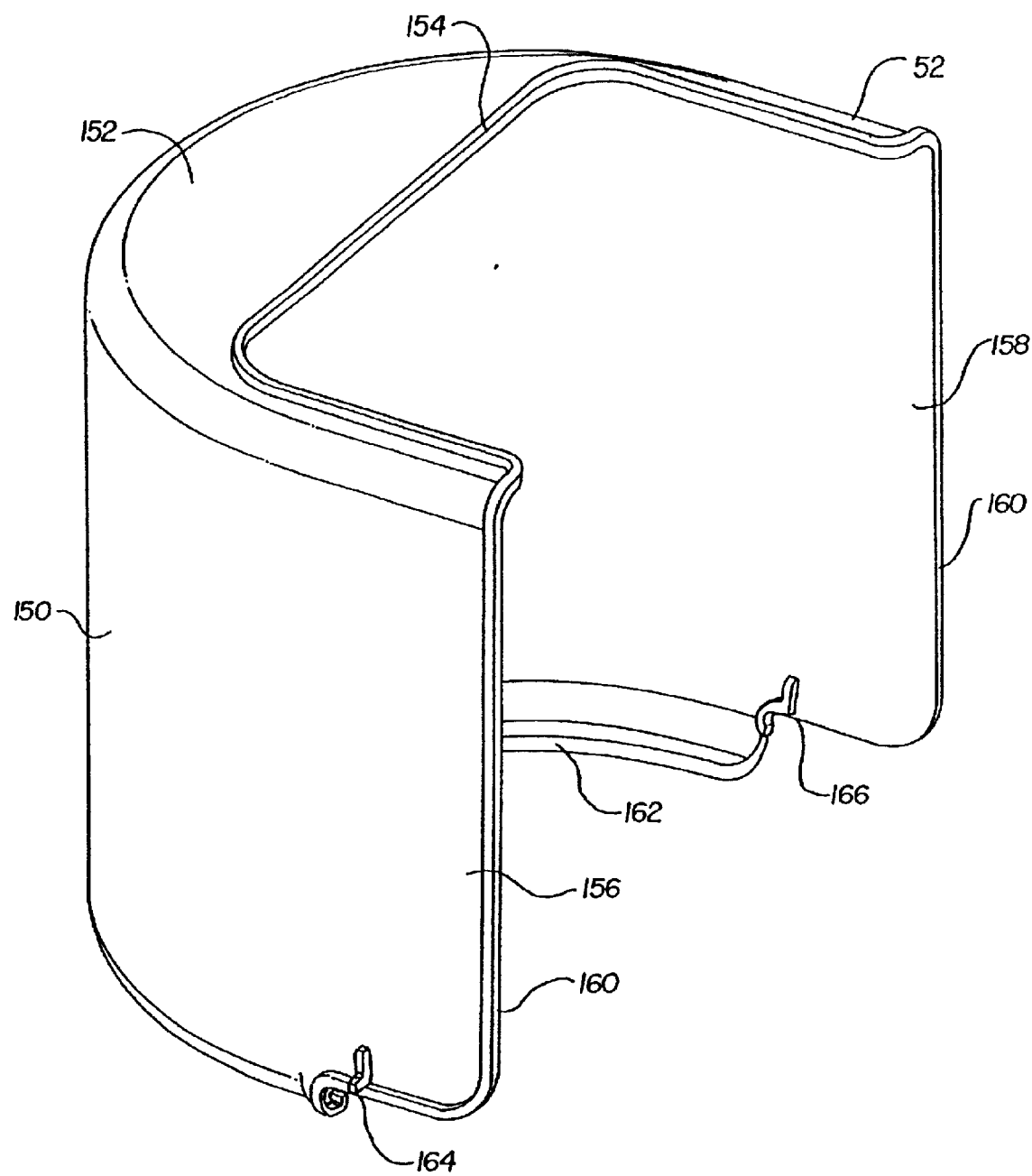

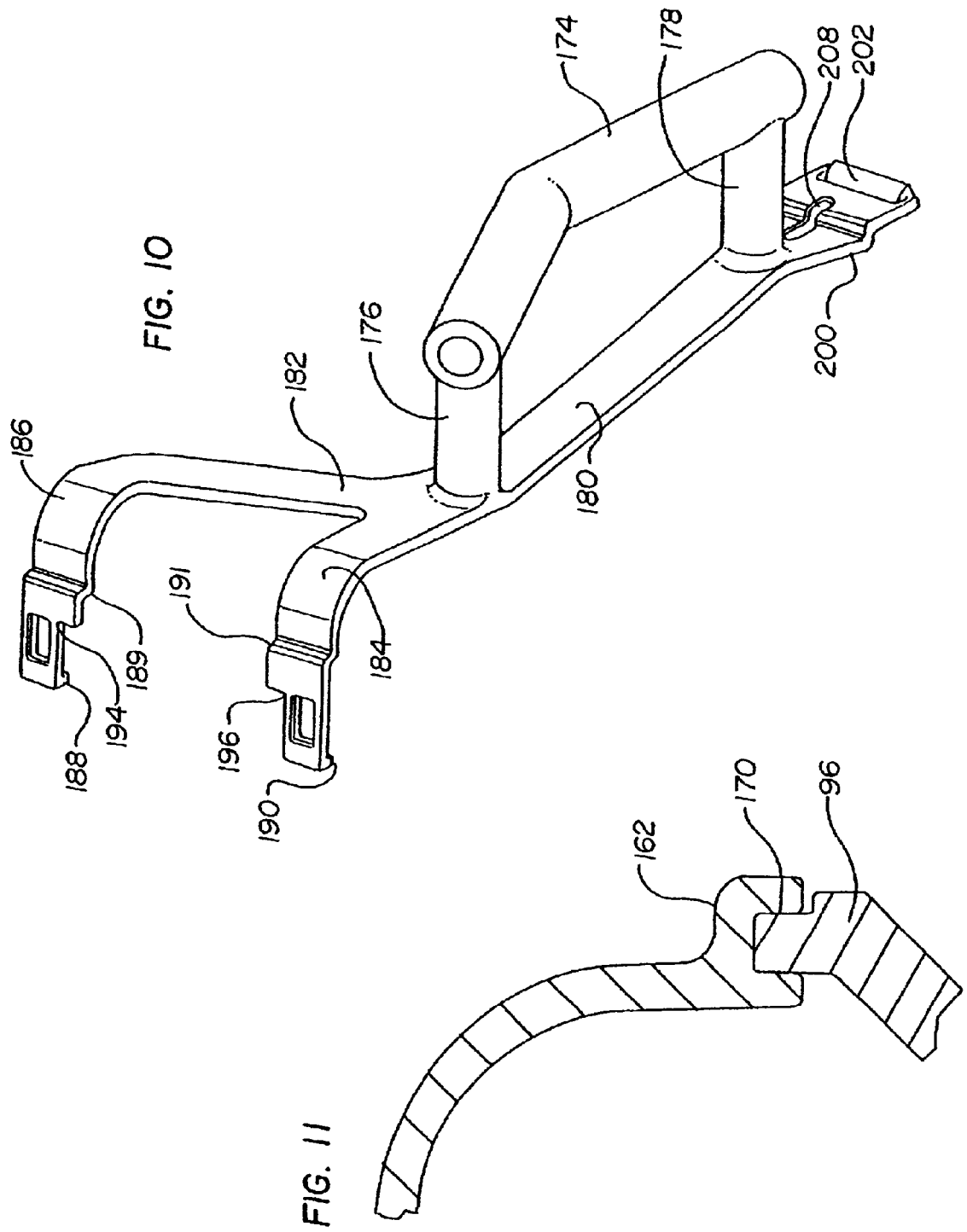

;# WAFER CONTAINER WITH MINIMAL CONTACT

This is a Continuation-in-Part of application No. 08/954,640, filed Oct. 20, 1997, now abandoned, which is a Continuation-in-Part of application Ser. No. 08/678,886, filed Jul. 12, 1996, now U.S. Pat. No. 5,788,082, Issued Aug. 4, 1998. The entire disclosures of these applications, including all amendments, are hereby incorporated by reference.

BACKGROUND OF THE INVENTION

This invention relates to semiconductor processing equipment. More specifically it relates to carriers for semiconductor wafers.

As semiconductors have become larger in scale, that is, as the number of circuits per unit area has increased, particulates have become more of an issue. The size of particulates that can destroy a circuit has decreased and is approaching the molecular level. Particulate control is necessary during all phases of manufacturing, processing, transporting, and storage of semiconductor wafers. Particle generation during insertion and removal of wafers into carriers and from movement of wafers in carriers during transport needs is to be minimized or avoided.

Build-up and discharge of static charges in the vicinity of semiconductor wafers can be catastrophic. Static dissipation capability is a highly desirable characteristic for wafer carriers. Static charges may be dissipated by a path to ground through the carrier. Any parts that are contacted by equipment or that may contact wafers or that may be touched by operating personnel would benefit by a path to ground. Such parts of carriers would include the wafer supports, robotic handles, and equipment interfaces.

Visibility of wafers within closed containers is highly desirable and may be required by end users. Transparent plastics suitable for such containers, such as polycarbonates, are desirable in that such plastic is low in cost but such plastics do not have adequate static dissipative characteristics nor desirable abrasion resistance.

Materials for wafer carriers also need to be rigid to prevent damage to wafers during transport and also need to be dimensionally stable through varying conditions.

Conventional ideal carrier materials with low particle generation characteristics, dimensional stability, and other desirable physical characteristics, such as polyetheretherketone (PEEK), are not transparent, are relatively expensive, and are difficult to mold into unitary large and complex shapes such as carriers and containers.

Generally containers and carriers for storing and transporting wafers have been designed to transport and hold wafers in vertical planes. Such carriers, for example the H-bar carriers well known in the art (see FIG. 18), are typically configured for also allowing a carrier position with the wafers in a horizontal position for processing and/or insertion and removal of the wafers. In the horizontal position the wafers are conventionally supported by ribs or wafer guides that form the wafer slots and extend along the length of the interior sides of the carrier. The carrier side is partially curved or angled to follow the wafer edge contour. Such carriers contact and support the wafers along two arcs on or adjacent to the wafer edge.

Additionally the shift of conventional carriers from the vertical transport position to the horizontal insertion-removal-process position can cause wafer rattle, wafer shifting, wafer instability, particle generation and wafer damage.

The industry is evolving into processing progressively larger wafers, i.e., 300 mm in diameter, and consequently larger carriers and containers for holding wafers are needed. Moreover the industry is moving toward horizontal wafer arrangements in carriers and containers. Increasing the size of the carriers has exacerbated shrinkage and warpage difficulties during molding. Increased dependence upon robotics, particularly in the removal and insertion of wafers into carriers and containers, has made tolerances all the more critical. What is needed is an optimally inexpensive, low particle generating, static dissipative carrier god in which the wafers are stable, and consistently and positively positioned and which minimizes the transfer of any particles on the carrier to the wafers.

SUMMARY OF THE INVENTION

A wafer container for transporting or holding wafers in a horizontal axially aligned arrangement has minimal four point regions of wafer support at the edge portion of the wafers. A preferred embodiment has a first container portion and a closeable door. The first container portion has a first molded portion of a static dissipative material having an upright door frame with integral planar top portion. An integral bottom base portion with an equipment interface also extends from the door frame. A second molded portion has a transparent shell which connects to the door frame, to the planar top portion, and to the bottom base portion. Separately molded wafer support columns connect to the top planar portion and to the bottom base portion and include vertically arranged shelves with upwardly facing projection providing minimal point or point region contact with the wafers. The shelves include wafer stops to interfere with forward or rearward movement of the wafers when supported by the projections and to prevent insertion beyond a seating position. A side handle engaging both the first molded portion and the second molded portion operates to secure the molded portions together. A robotic handle connects to the planar top portion. The robotic handle, the wafer shelves, the side handles, and the door frame have a conductive path to ground through the machine interface.

An additional embodiment is a conventional H-bar wafer carrier with protrusions added to the top side of the wafer guides such that when the H-bar carrier is positioned with the plane of the wafers in a horizontal arrangement the wafers have minimal contact with the carrier by the beads or protrusions on the wafer guides.

A feature and advantage of the invention is that wafer support is provided with minimal and secure wafer contact by the carrier.

A further advantage and feature of the composite container embodiment of the invention is that the composite design allows optimal use of materials, such as the more expensive abrasion resistant and static dissipative materials, for example PEEK, for the portions of the container that contact the wafers or equipment, and the use of less expensive clear plastic, such as polycarbonate, for the structural support of the container and the viewability of the wafers in the container. Thus, molding parameters and material selection may be chosen for each separately molded part to optimize performance and minimize cost.

A further advantage and feature of the composite container embodiment of the invention is that the composite construction minimizes the negative effects associated with molding large carriers such as warpage and shrinkage.

A further advantage and feature of the composite container embodiment of the invention is that all critical parts may be conductively connected to ground through the equipment interface portion of the carrier.

A further advantage and feature of the invention is that wafers are passively held in a specific seating position by the suitable shaped shelves.

A further advantage and feature of the invention is that the composite container may be assembled and finally secured together using the lugs, tongues, and tabs associated with the side handle.

A further feature and advantage of the invention is that the wafer contact with the protrusions or beads reduce accumulation of particulate matter on the wafers by minimizing the transferring of such particulate matter by minimizing the wafer contact with the carrier.

A further feature and advantage of the invention is that the protrusions or extensions on the top side of the wafer guides-may be formed in a variety of configurations.

A further feature and advantage of a preferred embodiment of the invention is that minimal point contact minimizes rocking of the individual wafers and provides for greater variations in molding while still maintaining consistent and positive wafer positioning. The critical dimension to be maintained is the top of the protrusions as compared to the entire length of the contact area on convention wafer guides.

BRIEF DESCRIPTION OF THE DRAWINGS

FIG. 9 is a front perspective view of the shell or second molded portion of one embodiment of the wafer carrier.

FIG. 10 is a perspective view of a side handle for a composite carrier.

FIG. 11 is a detail cross-sectional view of a connection between the first molded portion and the second molded portion.

DETAILED SPECIFICATION

Figure 1:
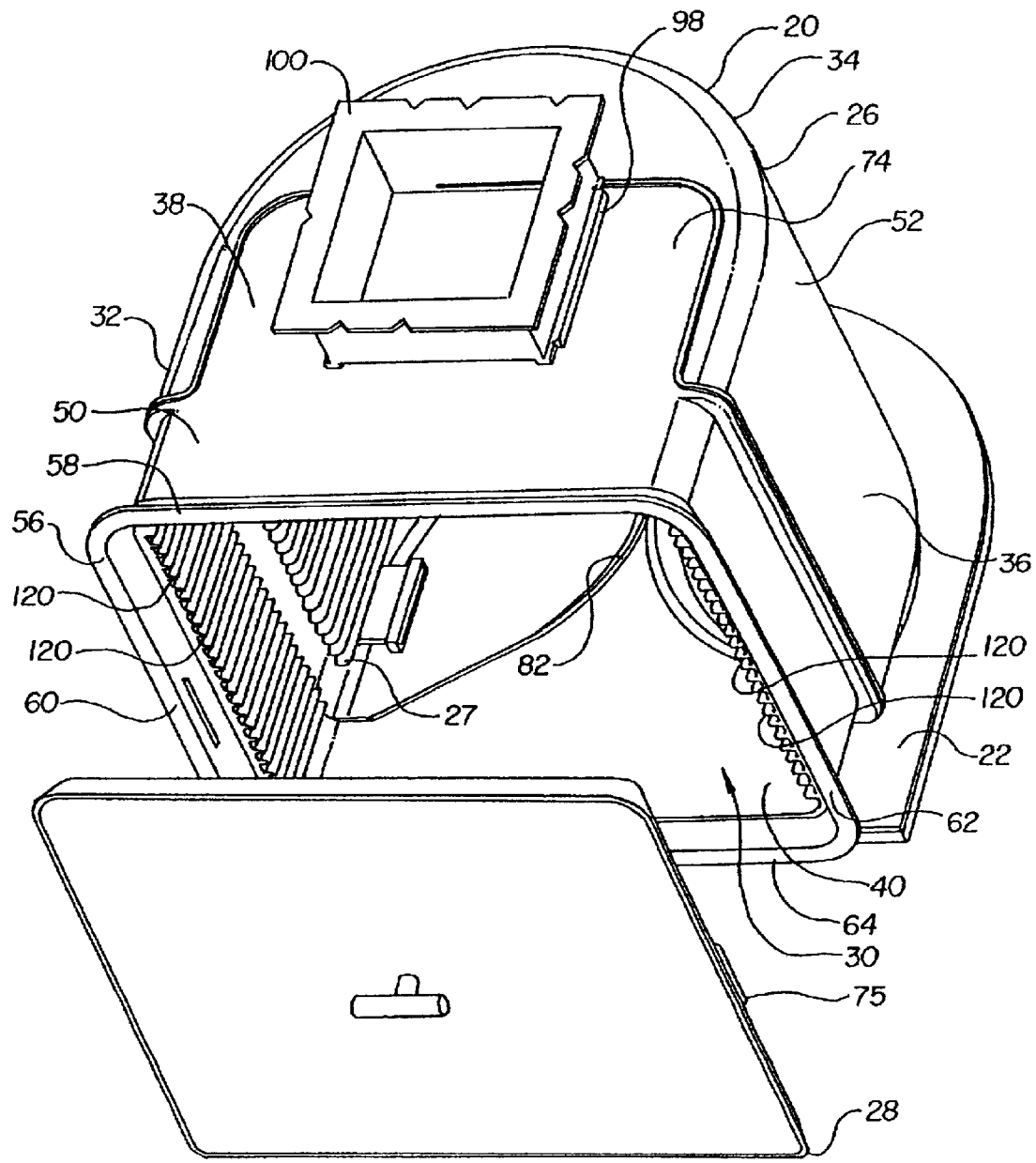
FIG. 1 is a partially exploded perspective view of a composite wafer container having a latchable door.

Referring to FIG. 1, a perspective view of a preferred embodiment of the horizontal wafer carrier in place on equipment 22. FIGS. 2, 3, 4, and 5 show additional embodiments. The wafer carriers are generally comprised of a container portion 26, including wafer support columns 27, and a cooperating door 28. The container portion 26 has a open front 30, a left side 32, a back side 34, a right side 36, a top 38, and a bottom 40. The embodiments of FIGS. 1, 2, 3, and 4 have closed back sides and closed left and right sides. The embodiment of FIG. 5 is a generally open carrier with an open back and with the top and bottom connected by and supported by the wafer support columns.

Figure 2:
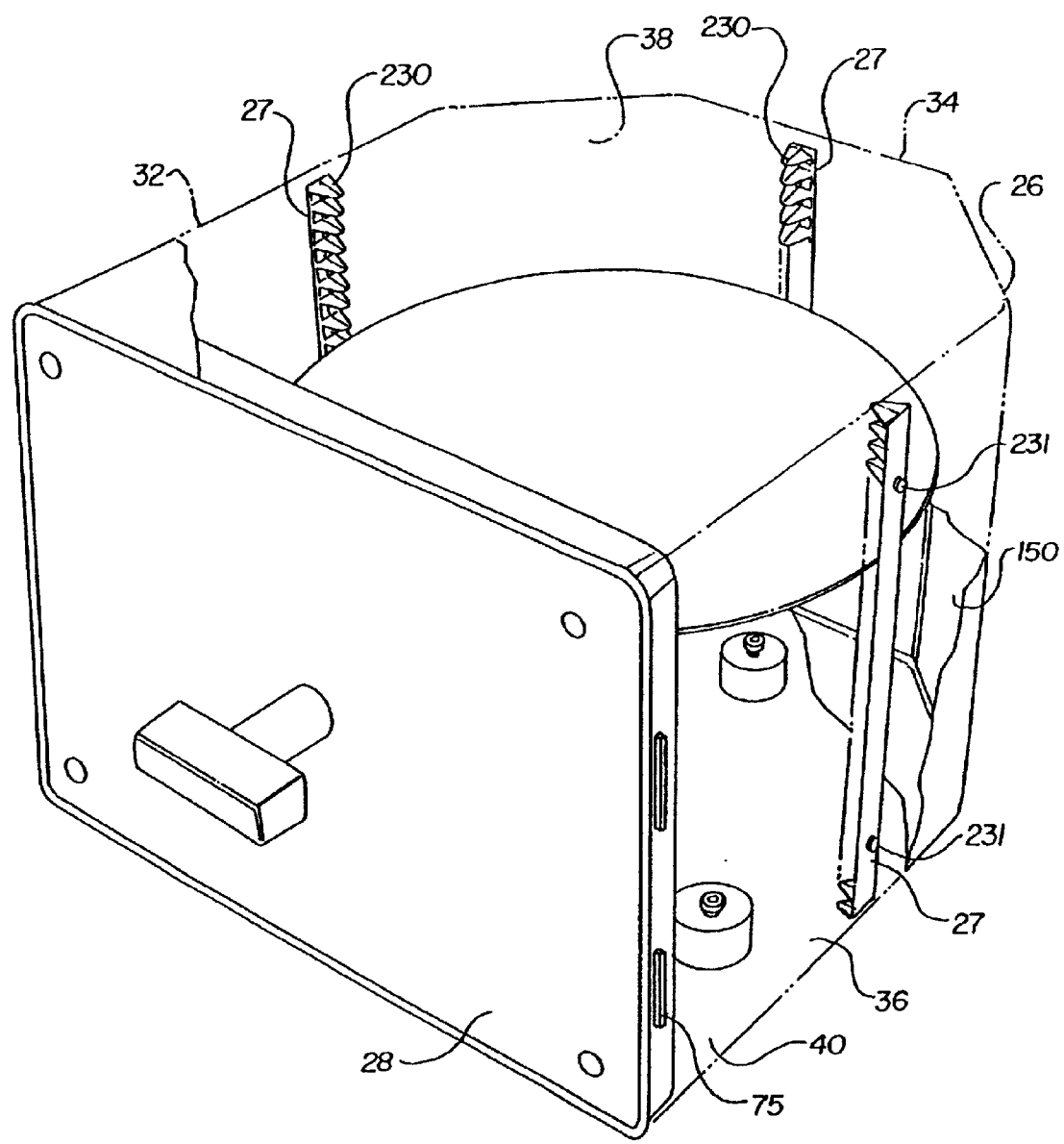
FIG. 2 is a front perspective view of a wafer container with three wafer support columns attached to a U-shaped transparent shell.
Figure 3:
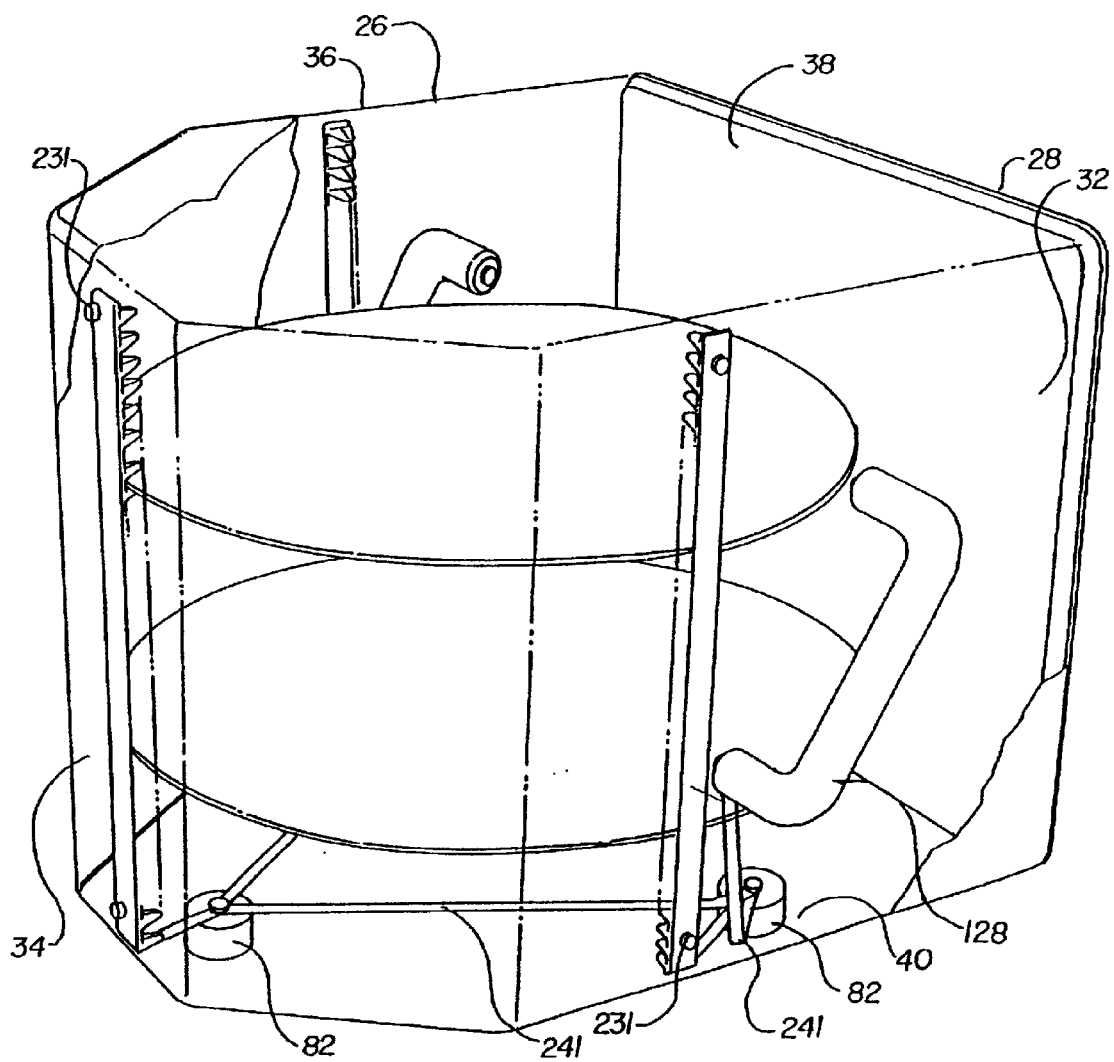
FIG. 3 is a rear perspective view of a carrier similar to that of FIG. 2, with plastic jumpers to provide a path to ground through the equipment interface.
Figure 4:
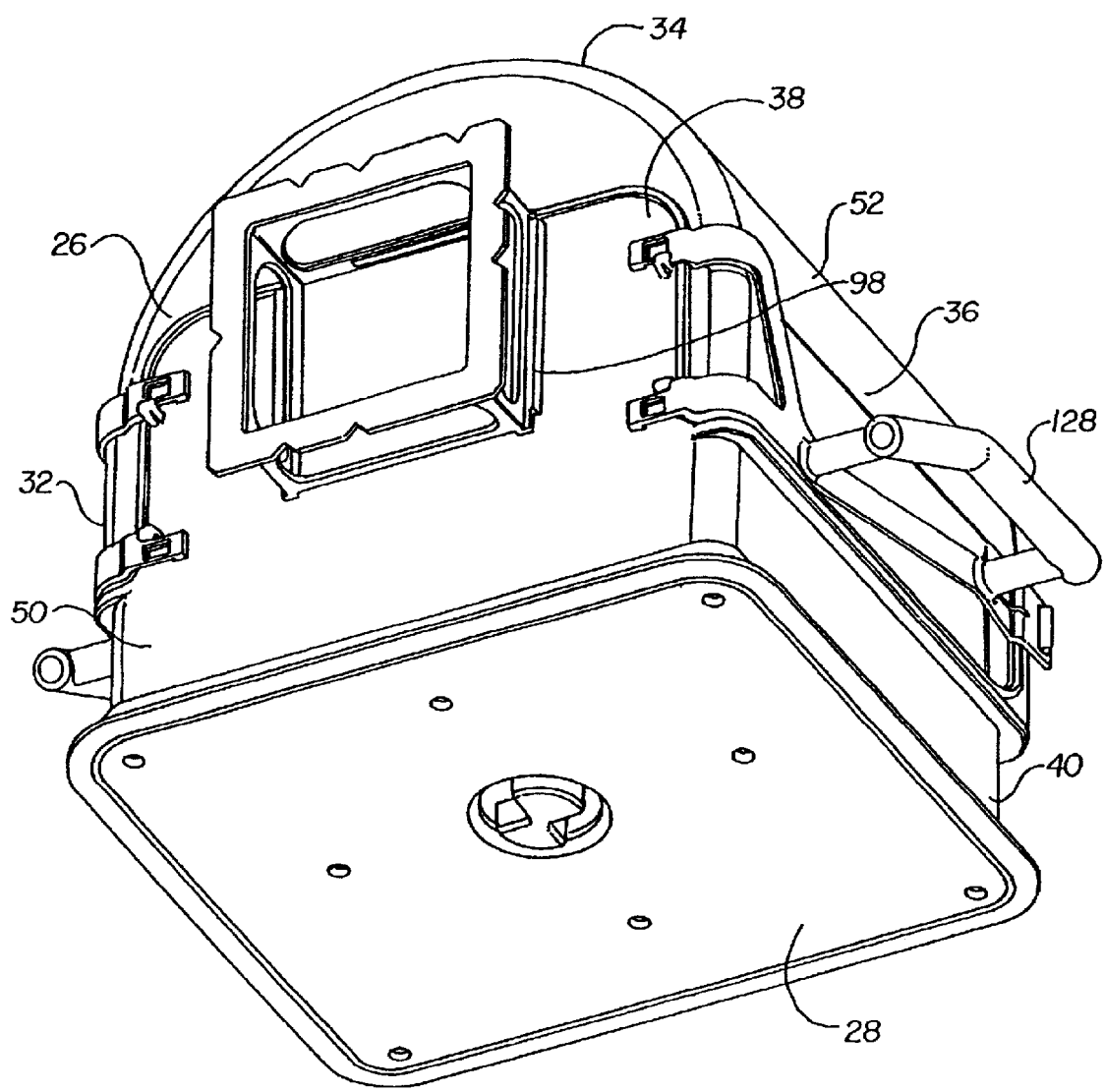
FIG. 4 is a front perspective view of a composite container with side handles, a robotic flange, and a latched door.
Figure 5:
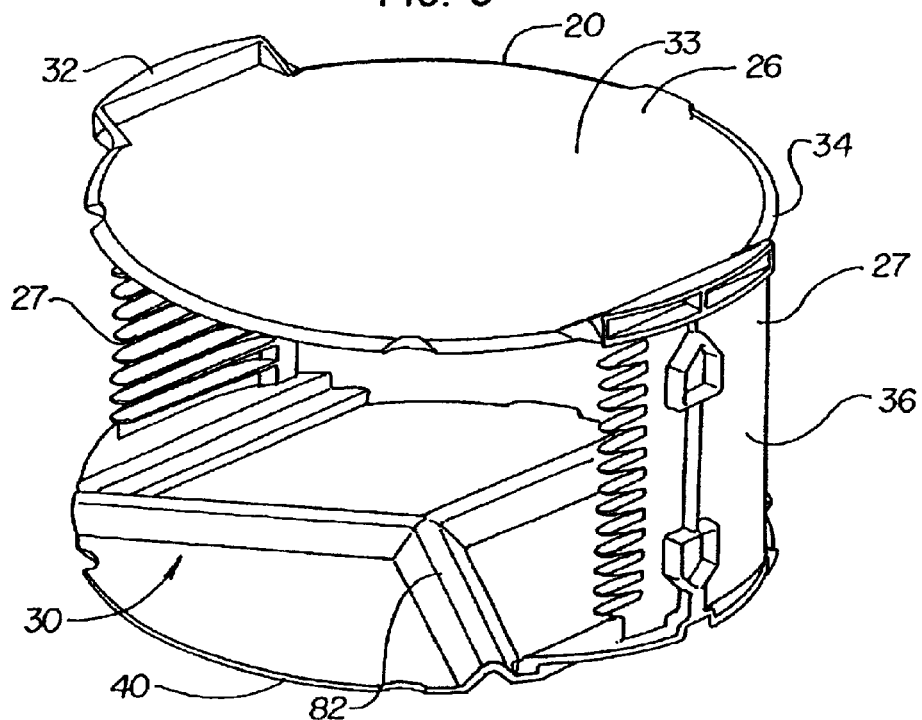
FIG. 5 is a front perspective view of an open wafer carrier according to the invention.
Figure 6:
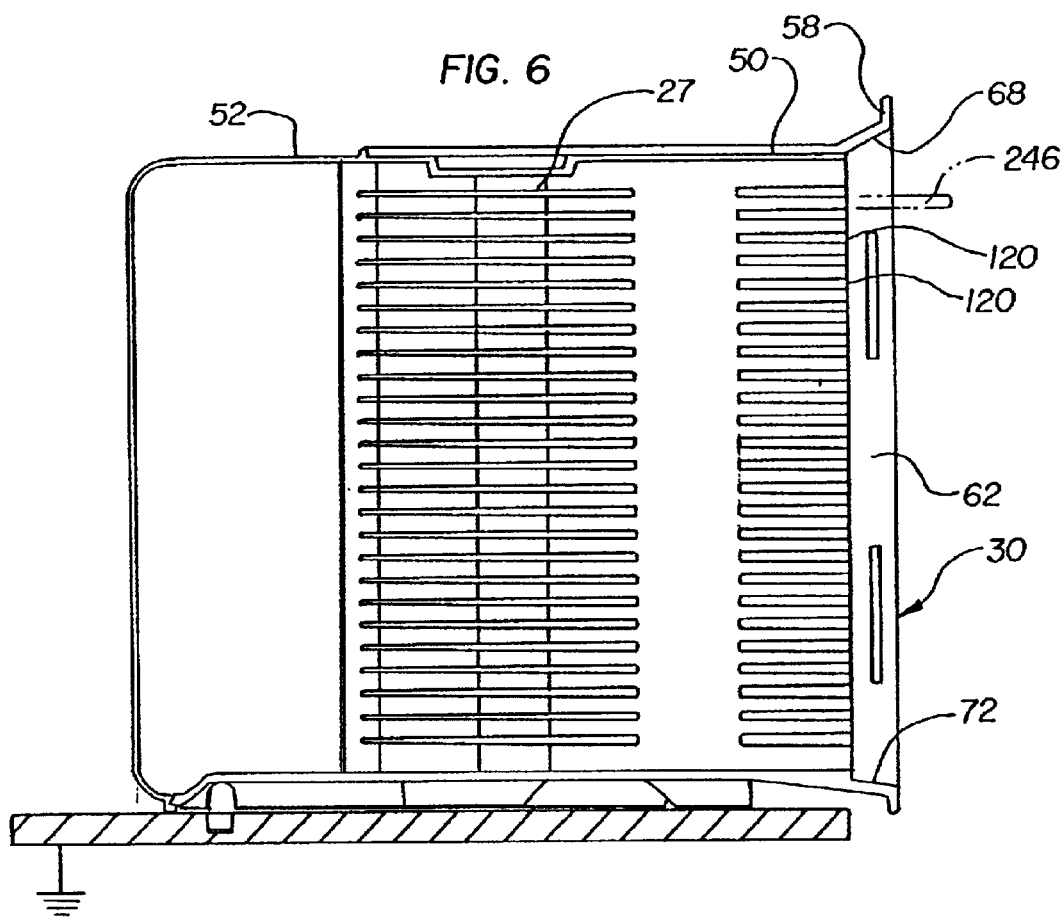
FIG. 6 is a cross-sectional side elevational view of a carrier.
Figure 7:
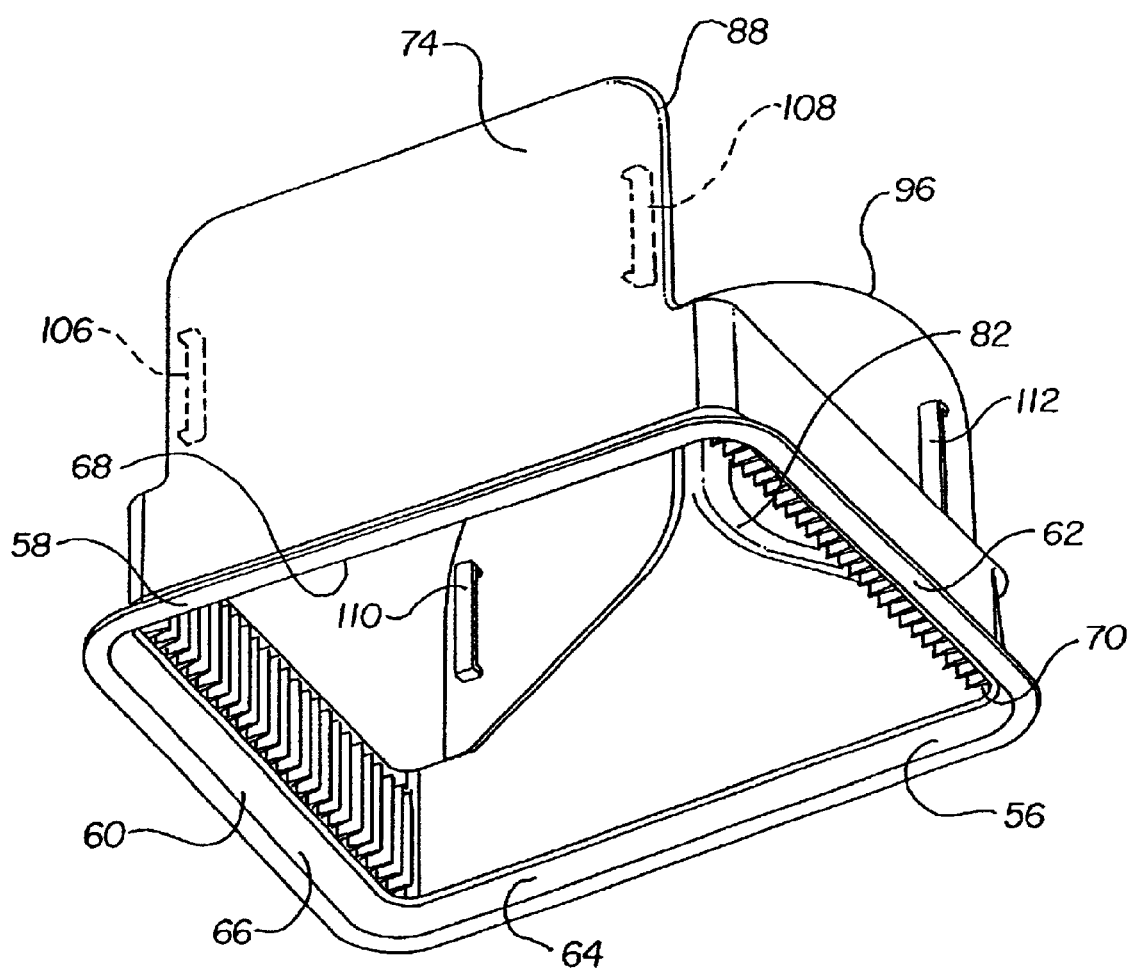
FIG. 7 is a front perspective view of one embodiment of the first molded portion of a wafer carrier.
Figure 8:
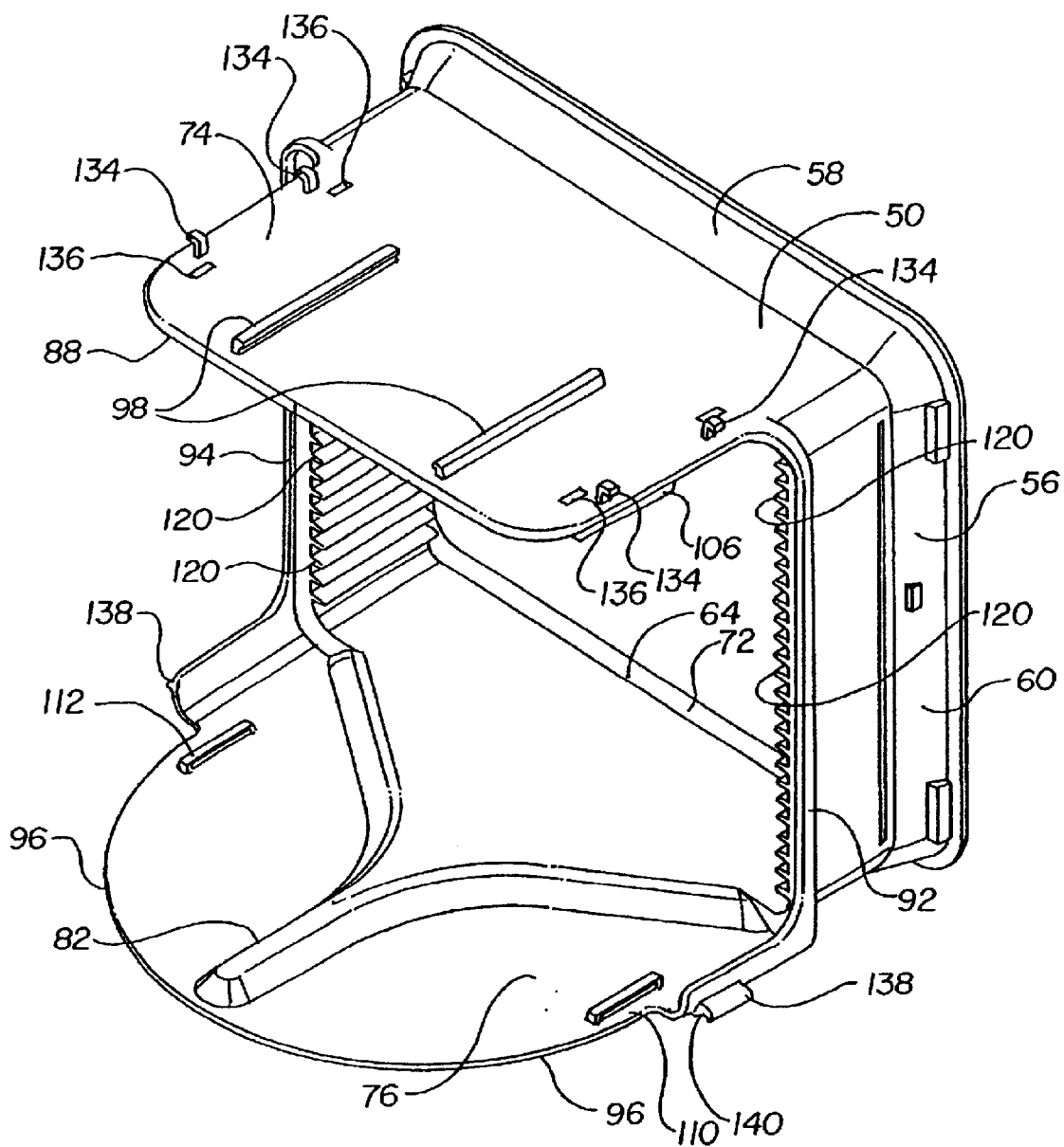
FIG. 8 is a rear perspective view of a first molded portion of one embodiment of the wafer carrier.

Referring specifically to FIGS. 1, 4, and 6 the embodiments shown therein, container portion 26 may be molded of a first molded portion 50 and a second molded portion 52. As shown in FIGS. 1 and 4, or may be molded of a single unitary molded portion as shown in FIGS. 2 and 3. The first molded portion 50, which is shown in isolation in FIGS. 7 and 8, is comprised of a rectangular door frame 56 with a horizontal top frame portion 58, a pair of upright vertical frame portions 60, 62 and a horizontal lower frame portion 64.

The upper frame portion 58 and the vertical frame portion 60, 62 have angled surfaces 66, 68, 70 for receiving and guiding the door during closing. The lower frame portion 64 has a substantially horizontal surface 72 best shown in FIG. 6. The door frame 56 by way of the angled surfaces 66, 68, 70 and the horizontal surface 72 receive the door 28 to close the open front 30. The door frame surfaces may have apertures or recesses 73 to receive tongues 75 which are retractably extendable from the door 28. Extending rearwardly from the upper frame portion 58 is a substantially horizontal top section 74. Extending rearwardly from the lower frame portion 64 is a lower base portion 76 having an equipment interface 82 which is shown configured as a kinematic coupling. A horizontal top section 74 has a horizontal edge portion 88 and the vertical frame portions 60, 62 have vertical edge portions 92, 94. Similarly, the lower base portion 76 has a lower horizontal edge portion 96. The horizontal top section 74 may include engagement flanges 98 for attachment of a handle or robotic flange 100. As shown in FIG. 7, the horizontal top section 74 has a pair of slotted members 106, 108 which correspond to the slotted members 110, 112 positioned on the lower base portion 76. Said slotted members are sized and configured to receive the wafer support columns 27. Extending from the vertical frame portions 60, 62 are a plurality of elongate wafer guides 120. As best shown in FIGS. 4 and 8 additional features may be added to the first molded portion 50 to facilitate connection with the second molded portion 52 and to facilitate the addition of side handles 128. Extending from the horizontal top section 74 are hooked lugs 134 and inset into said top section 74 are recesses 136. Attached to the lower base portion 76 are tabs 138 having a recess 140.

Referring to FIG. 9 the second molded portion 52 configured as a transparent plastic shell with a gently U-shaped curved panel 150, an upper top panel portion 152, an upper edge portion 154 configured as a splayed lip, vertical side panels 156, 158 also having splayed lip portions 160, a lower horizontal splayed lip 162 and a pair of outwardly extending side rejections 164, 166.

Referring to FIG. 11 a splayed lip 162 is shown in detail connecting to an edge portion 96 of the first molded portion 50. The joint is configured as a tongue in groove connection 170.

Referring to FIG. 10 a perspective piece part figure of a right handle 128 is portrayed. The side handle has a gripping portion 174 connected by way of post 176, 178 to a handle base 180 configured as a strip. The strip has a divided Y-shaped portion 18 which has curved portions 184, 186 to wrap around the curved top edge portion of the clear plastic shell and two downwardly extending tabs 188, 190 that fit into the recesses 136 in the horizontal top section 74 of the first molded portion 50. The horizontal top ends 189, 191 of the side handle 128 also have side engagement portions 194, 196 to engage with the lugs 134 also positioned on the horizontal top section 74. The lower end 200 of the side handle 128 has a receiving slot 202 for the tab 138 on the lower base portion 76 of the first molded portion 50. The lower end 200 also has a slot 208 to engage and secure the projection 176 on the vertical side panel 156 of the clear plastic shell.

The side handle 128 is formed of a rigid yet resiliently flexible plastic material such that the handle is strongly biased in the shape shown in FIG. 10. This allows the handle to essentially be snapped into place and to remain fixed on the sides 32, 36 and top 38 of the carrier, to engage both the first molded portion 50 and the second molded portion 52, and to steadfastly hold the assembly together.

Figure 12:
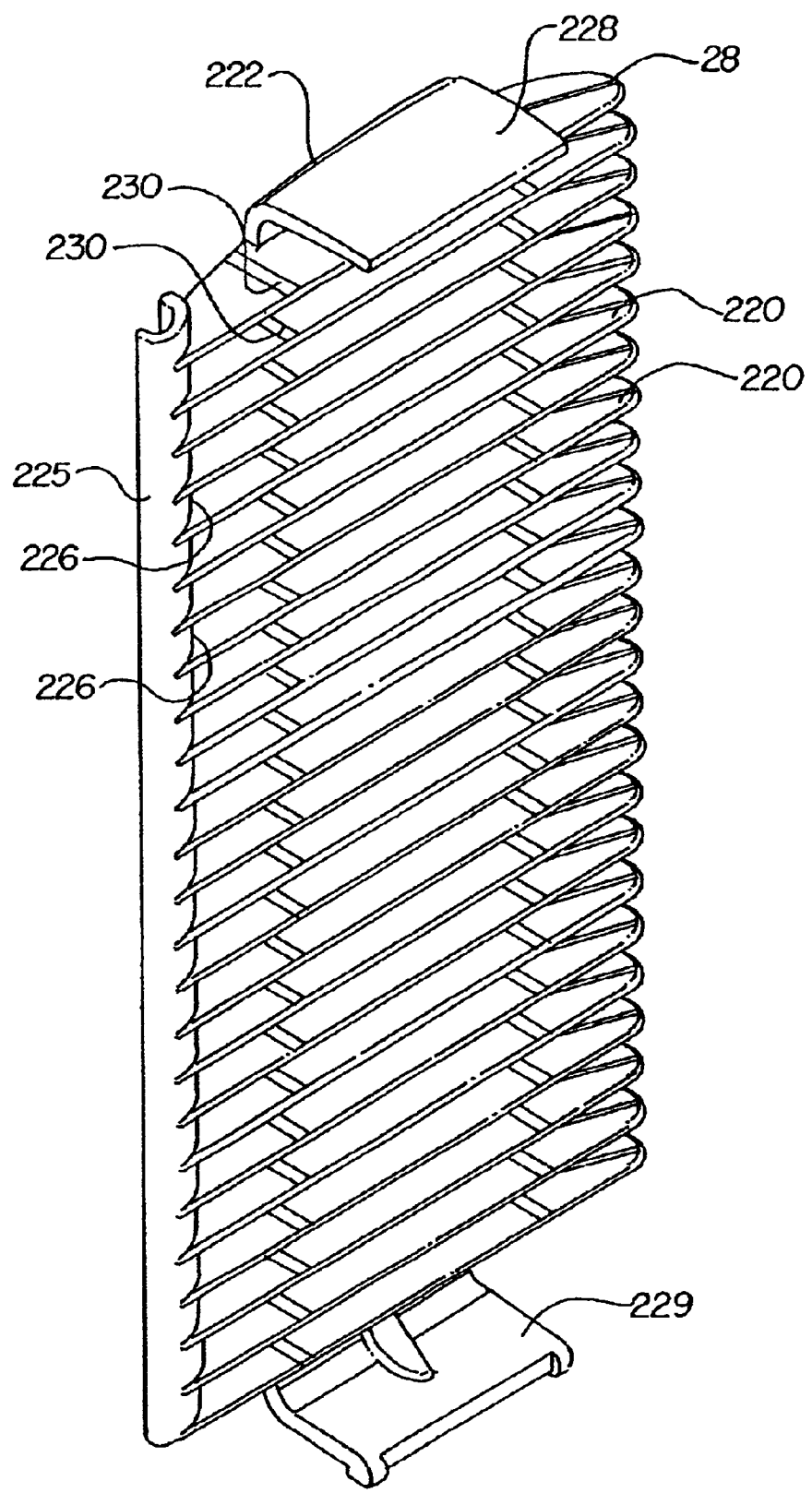
FIG. 12 is a perspective view of a wafer support column for a wafer container.
Figure 13:
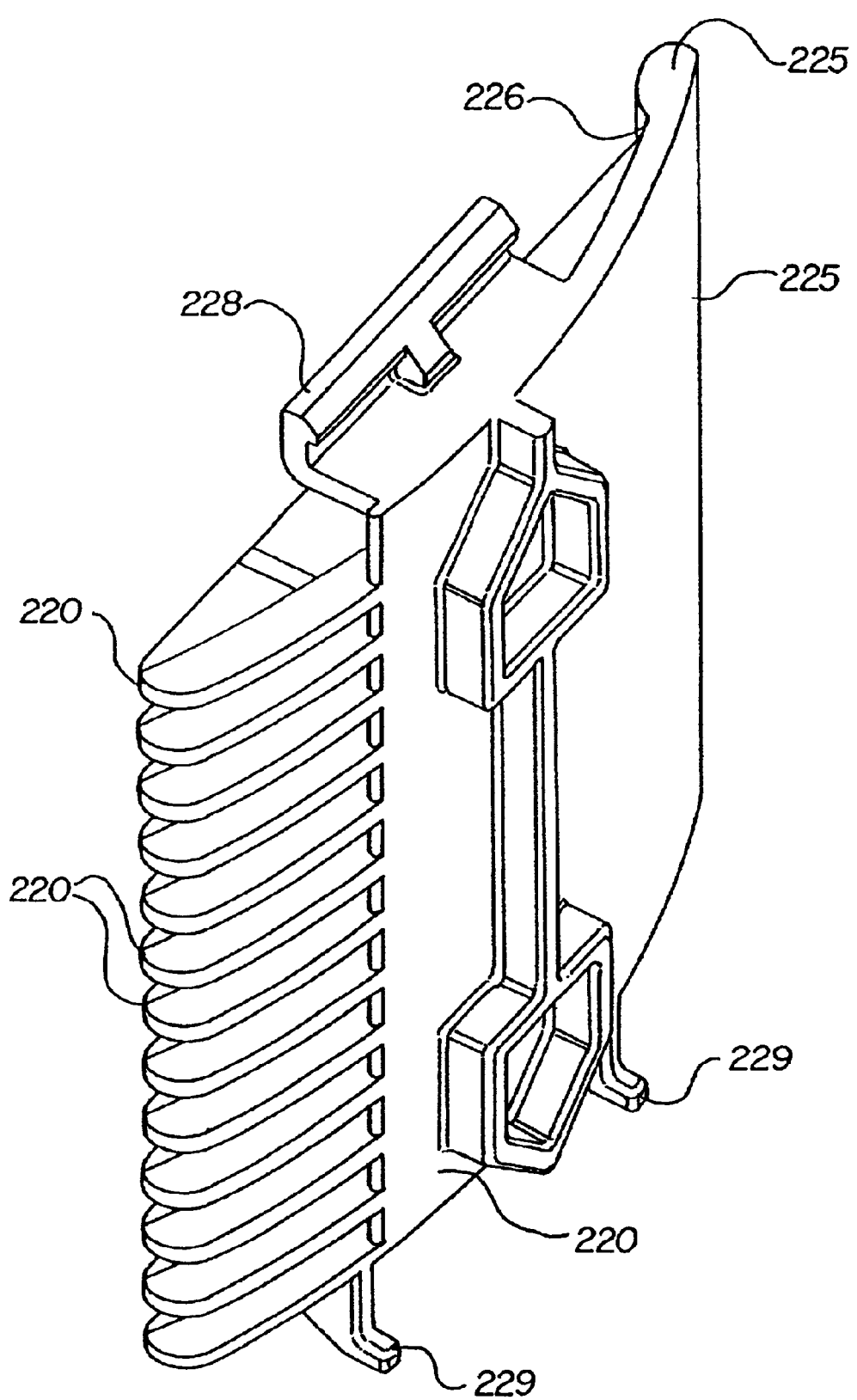
FIG. 13 is a perspective view of a wafer support column for the carrier of FIG. 5.
Figure 14:
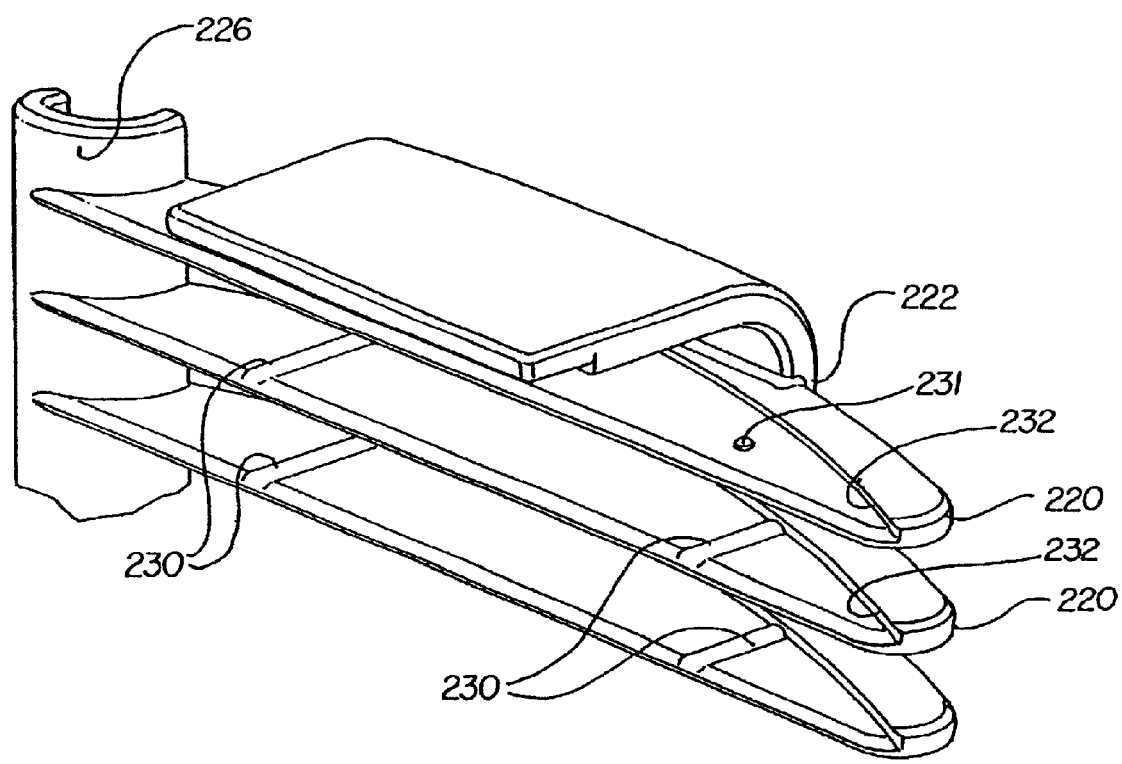
FIG. 14 is a detail perspective view of a portion of a wafer support column.

Referring to FIGS. 12, 13, 14, 15, and 16 wafer support columns 27 are shown in two principal configurations. FIG. 13 is a wafer support column suitable for the open carrier shown in FIG. 5. FIG. 12 and 14 show a configuration of wafer support columns 27 suitable for use in the carrier embodiment of FIG. 1 and FIG. 4. Both wafer support columns 27 attach into their respective carrier by way of tabs 138 or lugs 134. Alternate mechanical fastening means may also be utilized. Referring particularly to FIGS. 12, 13, and 14, the wafer support column 27 is comprised of a plurality of wafer guides or shelves 220 which connect to a vertical support member 222 and a rear post 225 with rear stops 226. Upper and lower tongue portions or lugs 228, 229 extend from the vertical support member 222 and are secure with the corresponding recesses or slotted members 106, 108, 110, 112. An alternative configuration of wafer support columns 27 are shown in FIGS. 2 and 3. These wafer support columns 27 are shown with direct attachment to the U-shaped panel 150 such as by screws 231. The wafer support columns of FIGS. 2 and 3 each have a plurality of individual wafer supports or shelves 220, each shelf having a single wafer engagement projection 230 configured as an elongate bead. Note that wafer support columns may, in some embodiments of the invention, be integral with the container portion and still provide many of the advantages and features identified above.

Referring to FIGS. 6, 14, 15, and 16, further details and positioning of the wafer support columns 27 and shelves are shown. Each shelf 236 has a corresponding opposite shelf 238 on the opposite side of the carrier. The opposing wafer support columns 27 with the opposing shelves are positioned on a center line through the wafer parallel to the open front 30 and door frame 56 and perpendicular to the direction 229 of insertion and removal of the wafers W. To support for the wafers, each of the opposing shelves are spaced less than a wafer diameter D apart. Each wafer guide 120 has an opposite wafer guide on the opposite side of the container.

Figure 15:
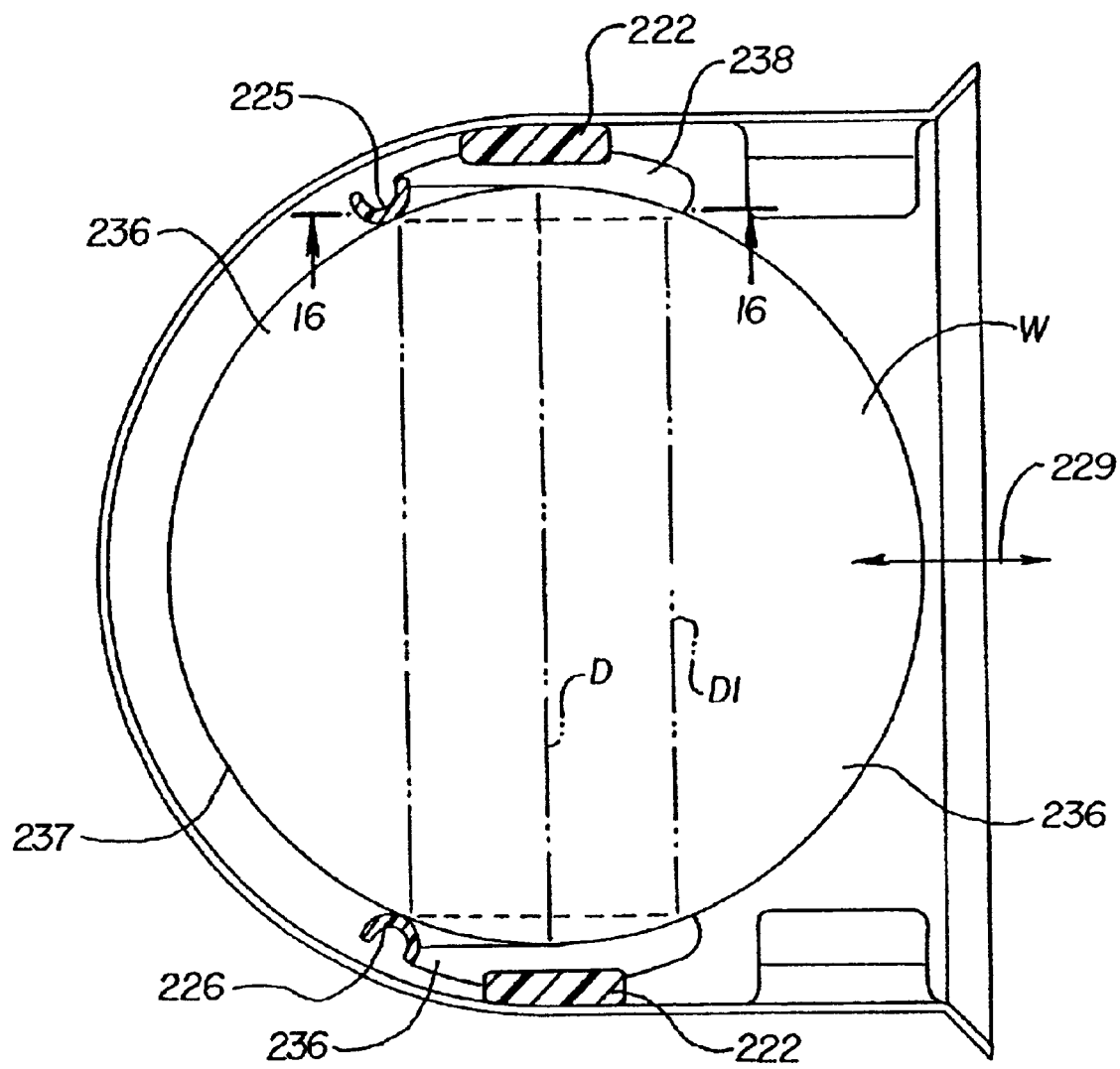
FIG. 15 is a cross-sectional plan view of a wafer carrier.
Figure 16:
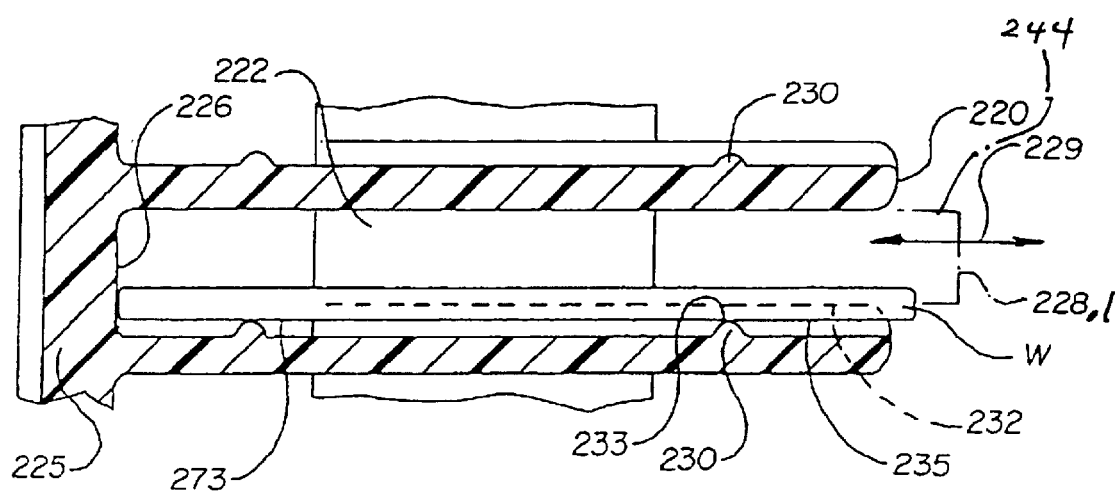
FIG. 16 is a cross-sectional view taken at line 16—16 of FIG. 15.
Figure 17:
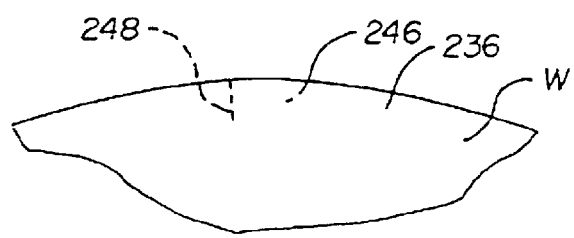
FIG. 17 is a plan view of an edge portion of a wafer illustrating the minimal point wafer contact and support.

Referring to FIG. 6, 15, and 16, the space between each vertically adjacent pair of wafer guides and the distance across the interior of the carrier defines a wafer insertion and removal level and a wafer slot 244. Similarly, the insertion and removal level 228.1 is defined by the area between vertically adjacent wafer support shelves 220. The wafer slot is further defined as the area across the carrier between the vertical support members of the wafer support column. Each shelf has a pair of upward facing wafer engagement projections 230 configured as beads. A bead may be a nub shaped generally as a partial sphere, as shown in FIG. 14 as element number 231, or a partial cylindrical rod with smooth ends element number 230. Referring to FIG. 17, such provide minimal point contact 246 or minimal abbreviated substantially radially oriented line contact 248 at the apex 233 of the projection. The apex contacts the underside or lower surface 235 of the wafer W at the edge portion 236. The elongate beads, as shown, extend substantially radially inward. Each wafer shelf 220 has a forward, that is, toward the front, wafer stop 232 configured as a vertical contact surface that follows the circumferential shape of the wafer W when the wafer is in the wafer seating position as shown in FIG. 15. The forward wafer stop 232 does not extend into the wafer insertion and removal level but does interfere with movement outwardly of wafers seated in the wafer seating position. The distance D1 between the corresponding forward wafer stops of each opposing wafer support shelf is less than the diameter D of the wafer W.

Each support shelf has a rear wafer stop 226 as part of the rear post 225. The rear wafer stop extends upwardly to define the rear limits of the wafer slot. The distance D2 between the corresponding rear wafer stops 226 of each opposing wafer shelf is less than the wafer diameter D. The rear wafer stops 226 extend into the vertical elevation of the wafer slot. The rear wafer top 226 can also serve to guide the wafer upon insertion into the wafer seating position 237 as shown best in FIGS. 15 and 16.

The above identified components which are shown as part of the first molded portion 50 may be unitarily molded and are thus integral with each of said other parts. Similarly the second molded portion 52 configured as the clear plastic shell is unitarily molded. The wafer support columns 27 will be formed of a static dissipative, high abrasion resistant material. The side handles and robotic flange will also be molded of static dissipative material. With the first molded portion 50 also formed of a static dissipative material, a conductive path to ground is provided for the robotic flange, the side handles, and the wafer shelves 220 and wafer support columns 27 through the equipment interface which is part of the first molded portion 50 and which engages a grounded interface on the equipment. Note that the equipment interface may be three sphere-three groove kinematic coupling as illustrated or a convention H-bar interface connecting each of the parts formed of static dissipative material as shown in FIGS. 1, 4, and 5 the parts may be conductively connected such as by conductive plastic jumpers 241 suitably connected to the parts as shown in FIG. 3.

Generally a carrier or component is considered to be static dissipative with a surface resistivity in the range of $10^5$ to $10^{12}$ ohms per square. For a material to provide a conductive path, such as to ground, resistance less than this may be appropriate.

Figure 18:
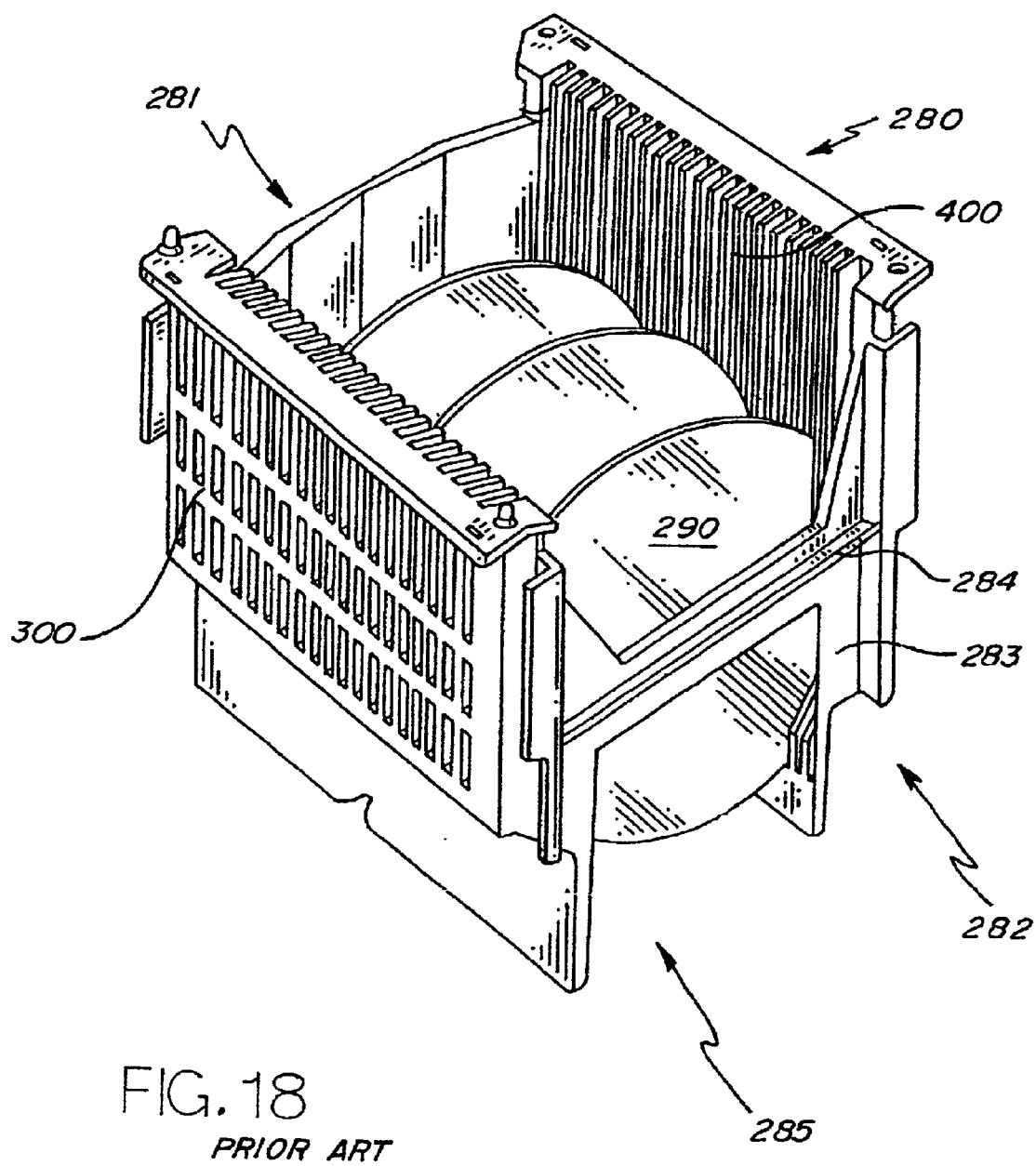
FIG. 18 is a perspective view of a prior art wafer carrier.

FIG. 18 shows an H-bar wafer carrier 280 typical to the art. Such H-bar carriers have two orientations in which they may be placed on equipment or other surfaces. One position has the wafers in an upright stacked arrangement with the wafers axially aligned with the axis of the wafers substantially horizontal. The second position has the wafers horizontal as the embodiments of FIGS. 1, 2, and 5. The wafer carrier 280 has a top side 281, a bottom side 282, a back side 285, a left sidewall 300 and a right sidewall 400. The bottom side 282, includes a bottom or end wall 283 with an H-shaped flange 284 which interfaces with wafer processing equipment (not shown). Although the wafer carrier 280 is shown with the wafers in vertical alignment in the figure, the components are identified with reference to the orientation with the bottom or endwall 283 generally horizontal and the wafers substantially horizontal.

Figure 19:
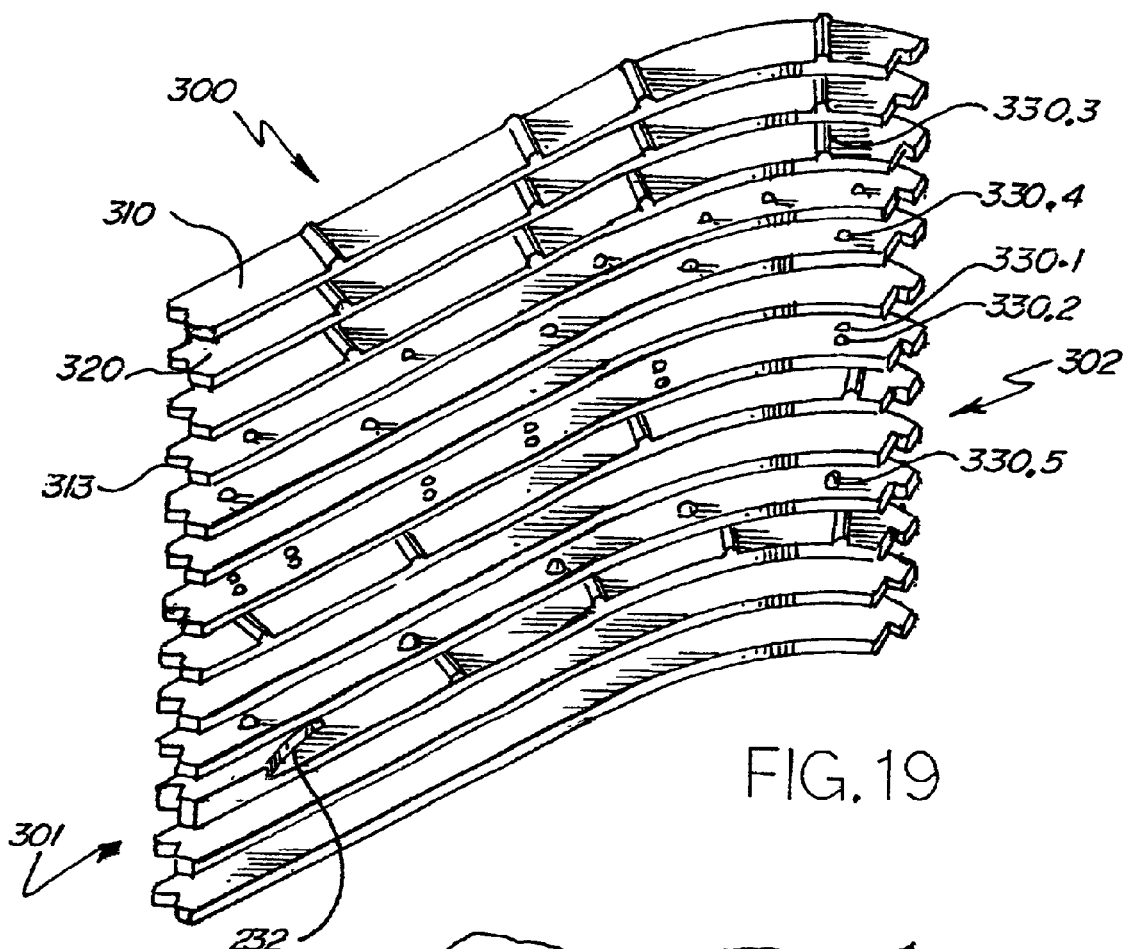
FIG. 19 is a perspective view of the left wafer guides of the sidewall of the wafer carrier depicted in FIG. 18.

FIG. 19, shows a section of the left side wall 300 of wafer carrier 280 as it would appear for the horizontal arrangement of at least one wafer. The left side wall 300 comprises a plurality of elongate wafer guides 310 which extend horizontally and inwardly to define a plurality of substantially horizontal wafer slots 320. The wafer guides 310 also have a front edge 313 which extends the length of the wafer guide 310 from the open front 301 to the backside 302 of the wafer carrier (not shown). The wafer guides 310 have an upper side 311 which include a plurality of protrusions or extensions 330.1; 330.2; 330.3; 330.4; and 330.5.

FIGS. 20–22 show orthographic views of segments of wafer guides 310 which include various embodiments of protrusions or extensions 330.1; 330.2; 330.3; 330.4; and 330.5.

Figures 20A, 20B, 20C, 20D:
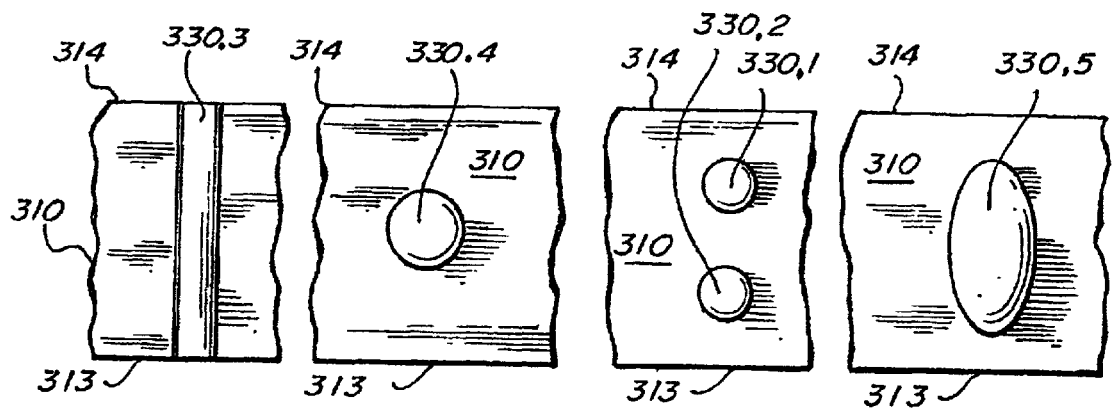
FIG. 20A are top plan views of upper sides of wafer guides showing various embodiments of the invention.
FIGS. 20B are top plan views of upper sides of wafer guides showing various embodiments of the invention.
FIGS. 20C are top plan views of upper sides of wafer guides showing various embodiments of the invention.
FIGS. 20D are top plan views of upper sides of wafer guides showing various embodiments of the invention.
Figures 21A, 21B, 21C, 21D:
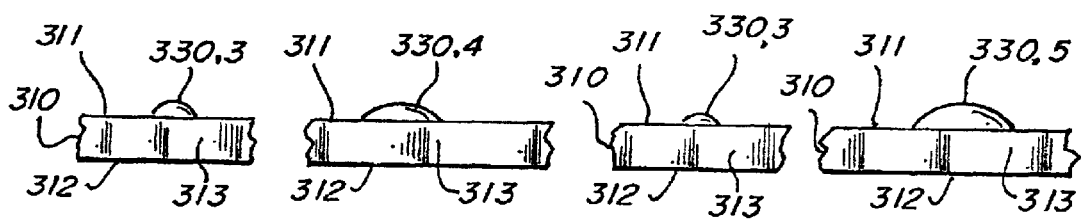
FIGS. 21A is a front views of the wafer guide of FIG. 20A.
FIGS. 21B is a front views of the wafer guides of FIG. 20B.
FIGS. 21C is a front views of the wafer guides of FIG. 20C.
FIGS. 21D is a front views of the wafer guides of FIG. 20D.

FIGS. 20A–D are top views of segments of wafer guides 310 which show various embodiments of protrusions or extensions 330.1; 330.2; 330.3; 330.4; and 330.5. In FIG. 20A, the protrusion or extension 330.3 is arranged such that it substantially spans the distance between the front edge 313 and rear 314 of wafer guide 310. As can be seen from the figure, protrusion or extension 330.3 is generally elongate and preferably orthogonal to the front edge 313 of wafer guide 310, such that the longitudinal axis (not shown) of protrusion or extension 330.3 points inwardly towards the center of the wafer carrier. In FIG. 20B, the protrusion or extension 330.4 is convexly shaped as a nub. Although the protrusion or extension 330.4 is depicted midway between the front edge 313 and the rear 314 of wafer guide 310, it is understood that protrusion or extension 330.4 may be positioned closer to either the front edge 313 or rear 314 without departing from the spirit and scope of the invention. In FIG. 20C, there are two protrusions or extensions 330.1 and 330.2 which are adjacent to each other along an inwardly facing axis which extends from the front edge of the wafer guide 310 towards the center of the wafer carrier. FIG. 20D depicts an oval shaped protrusion or bead 330.5.

FIGS. 21A–D are front views of the wafer guides 310 depicted in FIGS. 20A–D taken from the front edge 313 of the wafer guide 310. As can be seen, the protrusions or extensions 330.2, 330.3, 330.4, and 330.5 project from the upper side 311 of the wafer guide 310, while the lower side 312 of the wafer guide is generally planar. Although the protrusions or extensions 300A–D appear to project somewhat abruptly from the upper side 311 of the wafer guide 310, this is only done to better illustrate the invention. It is understood that the protrusions or extensions may be provided with a smooth transition between the upper side 311 and the protrusion or extensions 330.1; 330.2; 330.3; 330.4; and 330.5 if desired without departing from the spirit and scope of the invention.

Figures 22A, 22B, 22C, 22D:
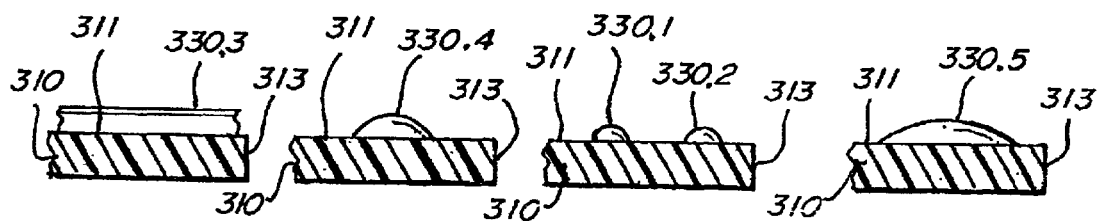
FIGS. 22A is a side views of the wafer guide of FIGS. 20A and 21A.
FIGS. 22B is a side views of the wafer guide of FIGS. 20B and 21B.
FIGS. 22C is a side views of the wafer guide of FIGS. 20C and 21C.
FIGS. 22D is a side views of the wafer guide of FIGS. 20D and 21D.

FIGS. 22A–D are side views of the wafer guides 310 depicted in FIGS. 20A–D. As can be seen, the protrusions or extensions 330.1, 330.2, 330.3, 330.4, and 330.5 project from the upper side 311 of the wafer guide 310. Note that FIG. 22A is somewhat different than FIGS. 22B–D in that protrusion or extension 330.3 generally traverses the width of the wafer guide 310 from the front edge 313 to the rear.

Referring to FIGS. 23A, 23B, 23C, and 23D, a cross-sectional view of an H-bar wafer carrier is shown with the wafer carrier in the orientation with its H-bar end horizontal. This series of figures demonstrates the feature in which the wafer is supported exclusively by way of the protrusions 330.3 while in the carrier in a wafer slot. In other words, at all positions in which the wafer may rest in a horizontal position on the wafer shelf or guide 310, said wafer is supported exclusively by the upwardly extending protrusions 330.3 and thus has minimal contact with the wafer carrier. As can be seen, the spacing between the protrusions on the wafer guide varies to provide the continuous support through all such positions. The spacing of such protrusions 330.3 will be dependent upon the relative dimensions of the wafer carrier and wafer along with the specific configuration of the protrusions. That is, in a situation where the protrusions are configured as a nub 330.4 as shown in FIG. 19 and displaced a distance from the inside front edge 313 of the wafer guide, more such nubs will be required than where a protrusion is an elongate bead 330.3 extending the full width of the wafer guide.

Figure 24:
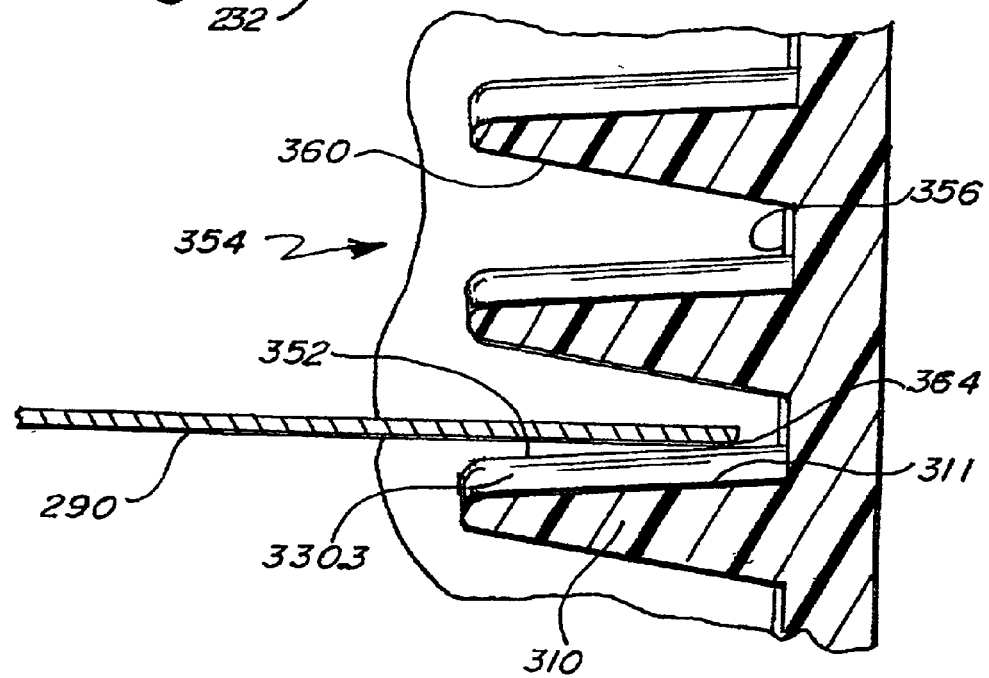
FIG. 24 is a cross-sectional view through line 24—24 of FIG. 23D.
Figure 23B:
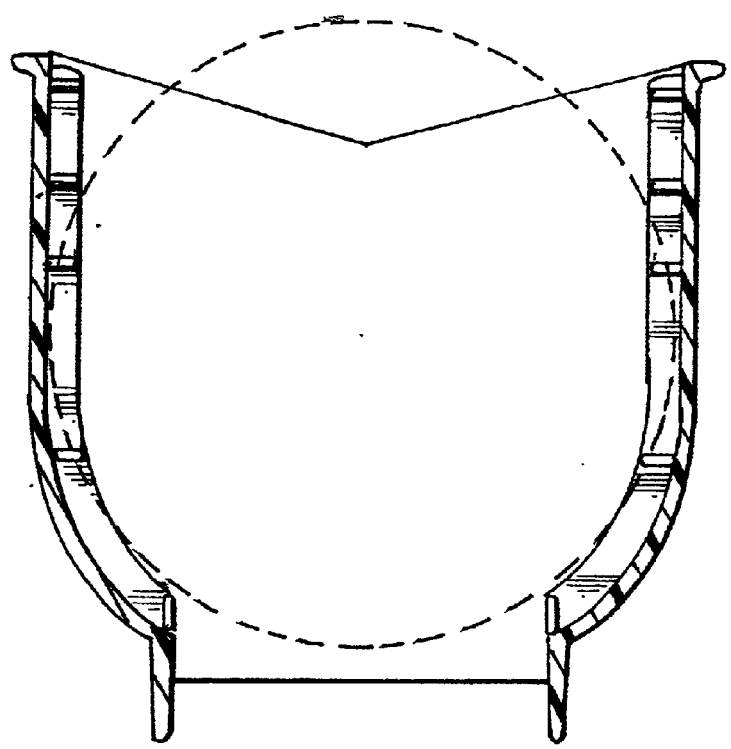
FIGS. 23B is a cross-sectional view from above through an H-bar wafer carrier showing the wafer support at an insertion retraction position.
Figure 23A:
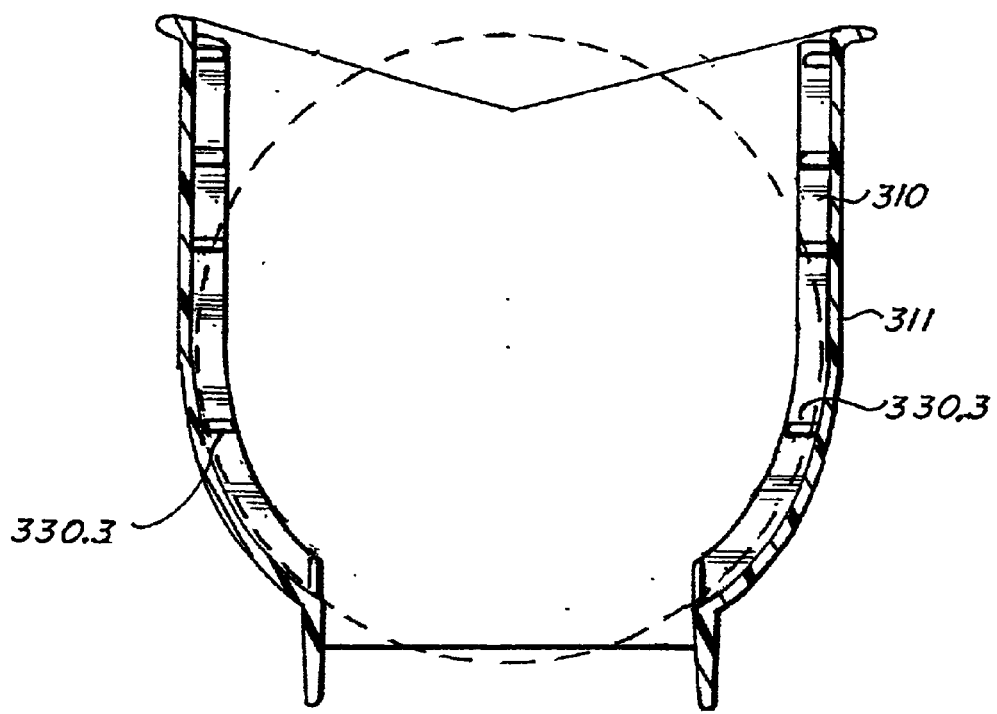
FIGS. 23A is a cross-sectional view from above through an H-bar wafer carrier showing the wafer support at an insertion retraction position.
Figure 23D:
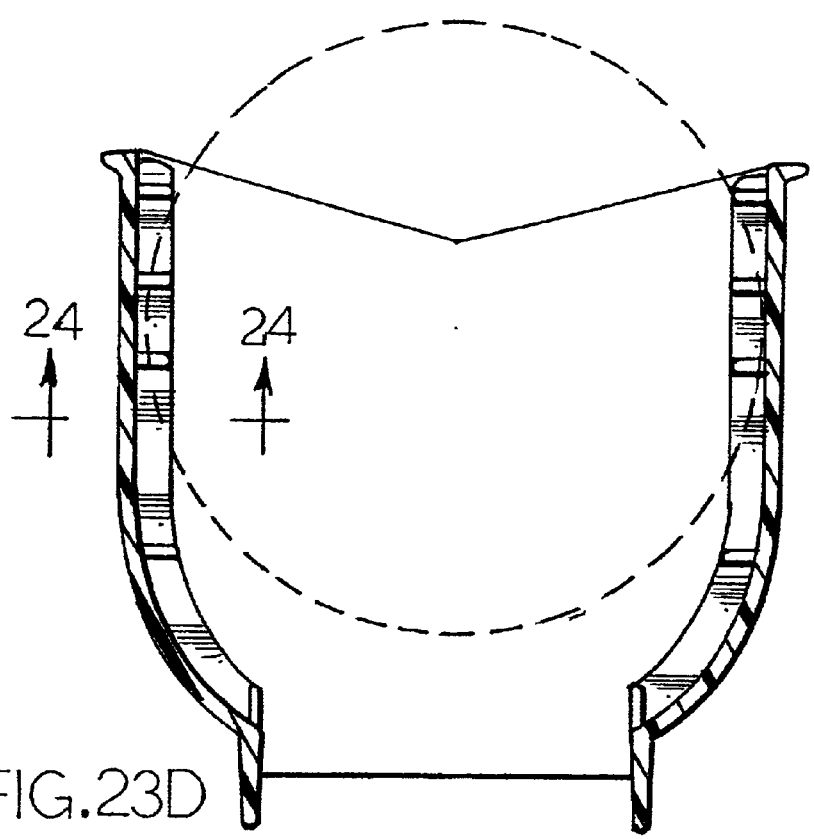
FIGS. 23D is a cross-sectional view from above through an H-bar wafer carrier showing the wafer support at an insertion retraction position.
Figure 23C:
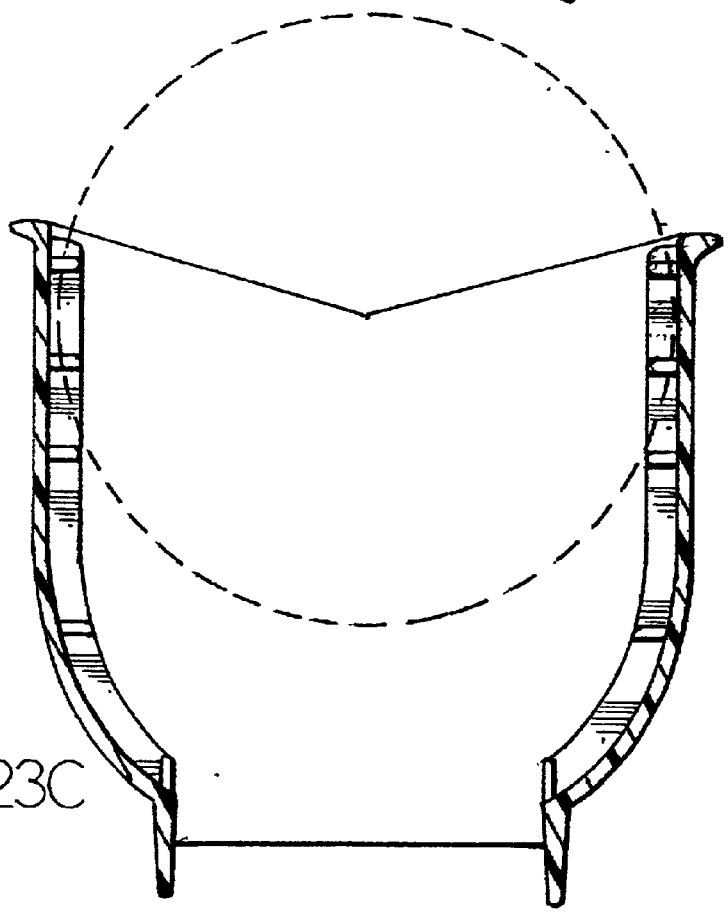
FIGS. 23C is a cross-sectional view from above through an H-bar wafer carrier showing the wafer support at an insertion retraction position.

Referring to FIG. 24, a cross section through the H-bar wafer carrier taken at line 24—24 of FIG. 23D is shown and illustrates the engagement of the wafer 290 with the wafer guide 310. The top surface 352 of the protrusion 330.3 is rounded as generally illustrated in FIG. 19 and FIGS. 21A–D and 22A–D. Each pair of adjacent wafer guides define a slot 354 for insertion, removal, and placement of the wafers 290. Intermediate each pair of wafer guides is a wafer flat 356 at each wafer slot 354. The region between opposite wafer flats substantially define an insertion and retraction level or region through which the wafer may be moved in and out of the carrier without contacting the wafer guides so long as the wafer is centered in the carrier. Note that as shown in FIG. 24, the top surface 352 of the wafer guide is inclined slightly from the plane of the seated wafer 290 and the lower surface 360 also is inclined at a slightly greater angle from the horizontal plane of the wafer 290. With the inclined top surface 352, the engagement of the wafer 290 is at the lower corner 357 of the wafer at a restricted point 364 on the protrusion 330.3. Where the top surface 352 is parallel to the plane of the wafer in its seated position, the engagement will be at a very limited slightly larger limited segmented region. FIG. 24 illustrates that the wafer during insertion and removal and when seated on the protrusion 330.3 is separated from the upper or top side 311 of the wafer guide by the thickness of the protrusion. Thus, any particles on said top side 311 of the guide foes not come in contact with and, therefore, will typically not have the opportunity to adhere to said wafer 290.

Figure 25:
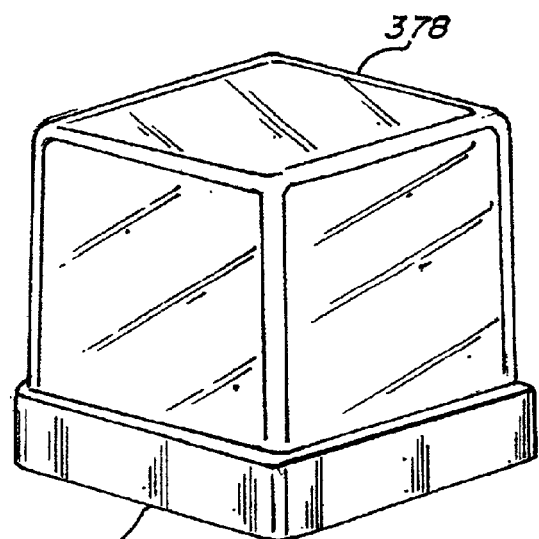
FIG. 25 is a perspective view of a prior art wafer container.
Figure 26:
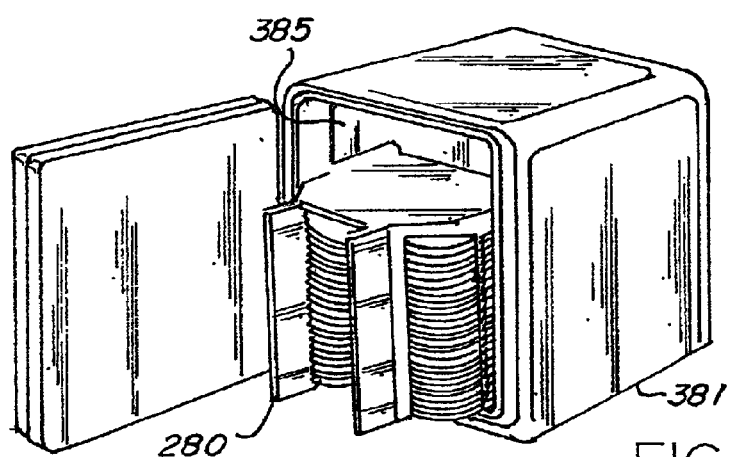
FIG. 26 is a perspective view of a prior art wafer container.
Figure 27:
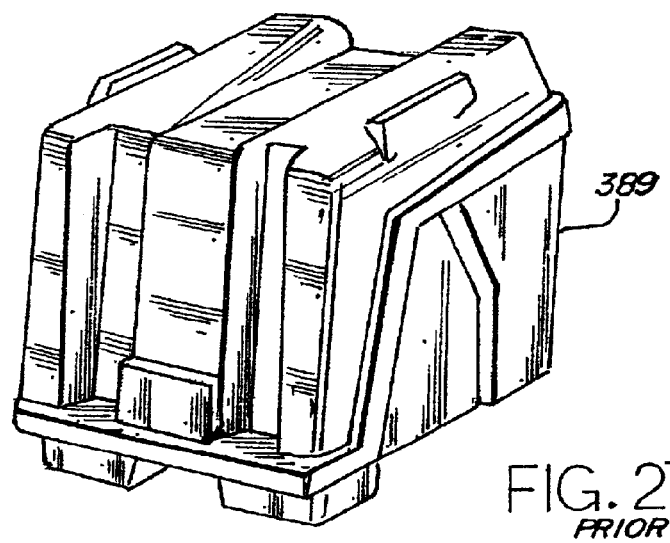
FIG. 27 is a perspective view of a prior art wafer container.

Referring to FIGS. 25, 26, and 27, three different containers are depicted, all of which are known in the art and are utilized in conjunction with H-bar carriers. FIG. 25 shows a SMIF pod 378 type of carrier in which the bottom side 380 comprises a removable door on which is placed a H-bar carrier. FIG. 26 depicts a transport type module 381 with a door 382 closing an open front 385 with a removable H-bar carrier 280. FIG. 27 depicts a box 389 for enclosing and transporting H-bar carriers. All such containers are openable for removal of the wafer with the separate H-bar carriers and all are suitably appropriate for use with minimal contact features on the wafer guides of the H-bar carriers.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. A wafer carrier for holding wafers in a substantially horizontal arrangement, the wafers having a lower surface, the carrier having an open front, a backside, a top portion, a bottom portion, a left side and a right side, the carrier further comprising:
   a pair of wafer support columns extending from the top portion to the bottom portion, one support column located at the right side and an opposite one located at the left side, each wafer support column comprised of a plurality of vertically arranged elongate shelves, each shelf of each support column having an opposite shelf on the opposite column, each shelf having the lengthwise dimension extending in a direction from the front to the backside and comprised of at least two upwardly extending elongate beads oriented towards said shelf's respective opposite shelf for providing minimal contact with the lower surface of a wafer at each bead, each shelf and its respective opposite shelf further having an insertion level and a seating level for a wafer, whereby a wafer may be inserted into the carrier through the open front at an insertion level and lowered to sit on the upwardly extending beads at the seating level.

2. A wafer carrier for holding wafers in a substantially horizontal arrangement, the wafers having a lower surface, the carrier having an open front, a backside, a top portion, a bottom portion, a left side and a right side, the carrier further comprising:
   a pair of wafer support columns extending from the top portion to the bottom portion, one support column located at the right side and an opposite one located at the left side, each wafer support column comprised of a plurality of vertically arranged elongate shelves, each shelf of each support column having an opposite shelf on the opposite column, each shelf having its lengthwise dimension oriented from the front to the backside and comprised of at least two upwardly extending elongate beads oriented transversely with respect to lengthwise dimension of the plurality of vertically arranged shelves for providing minimal contact with the lower surface of a wafer at each bead, each shelf and its respective opposite shelf further having an insertion level and a seating level for a wafer, whereby a wafer may be inserted into the carrier through the open front at an insertion level and lowered to sit on the upwardly extending beads at the seating level, and wherein each shelf is further comprised of a forward stop positioned at the seating level at least partially forward and inwardly of the upwardly extending beads thereby interfering with the forward movement of a wafer seated in said shelf, each shelf further having a rearward stop positioned rearwardly and inwardly of the upwardly extending beads thereby interfering with the rearward movement of a wafer in said shelf, said forward stop not extending into the insertion level whereby the wafer may be inserted and removed at the insertion level without interference with said forward stop.

3. A wafer carrier for holding wafers in a substantially horizontal arrangement, the wafers having a lower surface, the carrier having an open front, a backside, a top portion, a bottom portion, a left side and a right side, the carrier further comprising:
   a pair of wafer support columns extending from the top portion to the bottom portion, one support column located at the right side and an opposite one located at the left side, each wafer support column comprised of a plurality of vertically arranged elongate shelves, each shelf of each support column having an opposite shelf on the opposite column, each shelf oriented lengthwise from the front to the backside and comprised of at least two upwardly extending elongate beads oriented transversely with respect to lengthwise orientation of the plurality of vertically arranged shelves for providing minimal contact with the lower surface of a wafer at each bead, each shelf and its respective opposite shelf further having an insertion level and a seating level for a wafer, whereby a wafer may be inserted into the carrier through the open front at an insertion level and lowered to sit on the upwardly extending beads at the seating level, the wafer carrier further comprising a molded outer transparent shell extending around and enclosing the left side, the backside and the right side and further comprising a door for closing the open front.

4. The wafer carrier of claim 3 wherein each column of wafer support shelves are formed separately from the outer shell and wherein the columns are attached to the outer shell.

5. The wafer carrier of claim 3 wherein each column of shelves is separately formed from the outer shell and each column is formed of a static dissipative material, wherein the carrier further comprises a plurality of parts formed of static dissipative plastic material, wherein said parts are conductively connected by way of static dissipative plastic.

6. The wafer carrier of claim 5 wherein the static dissipative plastic is configured as at least one jumper extending from one part to another part.

7. The wafer carrier of claim 5 wherein said parts include a robotic flange, a side handle, and a bottom base portion having an equipment interface said bottom base portion separately formed from the outer shell and formed of a static dissipative plastic material, said robotic flange separately formed from the outer shell and formed of a static dissipative plastic material.

8. The wafer carrier of claim 7 wherein the bottom base portion comprises a kinematic coupling.

9. A wafer carrier for holding wafers, the wafer carrier having an open front, an open interior, a closed backside, a top portion, a bottom base portion, a closed left side, a closed right side, a pair of wafer supports positioned in the open interior, a pair of side wall handles and a robotic flange at the top portion the carrier, the robotic flange, the side wall handles, the wafer supports, and the bottom base portion all formed of static dissipative plastic and conductively connected together.

10. The wafer carrier of claim 9 further comprising a conductive plastic jumper.

11. The wafer carrier of claim 10 wherein the conductive plastic jumper is fixed in the interior of the wafer carrier.

12. The wafer carrier of claim 10 wherein the conductive plastic jumper is connected to one of the side wall handles.

13. A wafer carrier for holding wafers, the wafer carrier having an open front, an open interior, a nonconductive plastic shell, a top, a bottom base portion, a closed left side, a closed right side, a pair of wafer supports positioned in the open interior, a pair of side wall handles attached to the nonconductive plastic shell, a robotic flange at the top, the robotic flange, the side wall handles, the wafer supports, and the bottom base portion all formed of static dissipative plastic and conductively connected together.

14. The wafer carrier of claim 13 further comprising a kinematic coupling on the bottom base portion.

15. The wafer carrier of claim 13 further comprising a conductive plastic jumper providing a conductive connection.

16. The wafer carrier of claim 13 wherein the plastic shell is transparent.

17. A wafer carrier for holding a plurality of wafers in an axially aligned stacked arrangement, the carrier comprising:

a container portion having a left side, a right side, an open front and an open interior for receiving and holding the wafers, the container portion having a plurality of shelves at the right side in the interior and a plurality of opposite shelves at the left side in the interior, each shelf on the left side having a pair of upwardly extending elongate protrusions oriented towards the right side for supporting the wafers, each shelf on the right side having a pair of upwardly extending elongate protrusions oriented towards the left side for supporting the wafers; and a door for closing the open front.

* * * * *